(12) United States Patent
Fukuda et al.

(10) Patent No.: US 11,341,292 B2
(45) Date of Patent: May 24, 2022

(54) PRODUCTION PLAN SUPPORTING APPARATUS AND METHOD

(71) Applicant: Hitachi, Ltd., Tokyo (JP)

(72) Inventors: Satoshi Fukuda, Tokyo (JP); Yuuichi Suginishi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 313 days.

(21) Appl. No.: 16/575,305

(22) Filed: Sep. 18, 2019

(65) Prior Publication Data

US 2020/0210548 A1    Jul. 2, 2020

(30) Foreign Application Priority Data

Dec. 26, 2018  (JP) .............................. JP2018-243296

(51) Int. Cl.
    *G06F 30/17*    (2020.01)
    *G06N 7/00*     (2006.01)

(52) U.S. Cl.
    CPC ............. *G06F 30/17* (2020.01); *G06N 7/005* (2013.01)

(58) Field of Classification Search
    CPC ......... G06F 30/00; G06F 30/17; G06N 7/005; G06Q 10/06
    USPC ................................................... 703/17, 13
    See application file for complete search history.

(56) References Cited

U.S. PATENT DOCUMENTS 5,544,348 A * 8/1996 Umeda ................... G06F 30/20
                                                    703/17

FOREIGN PATENT DOCUMENTS

| JP | S57-168847 A | 10/1982 |
|----|--------------|---------|
| JP | H03-239460 A | 10/1991 |
| JP | H04-064164 A | 2/1992  |
| JP | 08-174386 A  | 7/1996  |
| JP | H11-282824 A | 10/1999 |
| JP | 2002-073146 A | 3/2002 |
| JP | 2002-268722 A | 9/2002 |
| JP | 2014-186422 A | 10/2014 |
| JP | 2014-203359 A | 10/2014 |

(Continued)

OTHER PUBLICATIONS

Li, Congbo et al., "A Modeling Approach to Analyze Variability of Remanufacturing Process Routing", Jan. 2013, vol. 10, No. 1, IEEE Transactions on Automation Science and Engineering, IEEE. (Year: 2013).*

(Continued)

*Primary Examiner* — Cedric Johnson
(74) *Attorney, Agent, or Firm* — Procopio, Cory, Hargreaves & Savitch LLP

(57) ABSTRACT

A production plan supporting apparatus and method capable of effectively supporting making of a production plan for a product whose production process has a branch(es). According to the production plan supporting apparatus and method when sequentially inputting a work(s) on a production unit basis to a production process in accordance with a predetermined input plan, first models regarding each of which probability of existence of the work in each time slot of each process is calculated are generated for respective production units, and a second model in which all the generated first models for the respective production units are stacked over one another is generated; and the time slot of the process which will become a bottleneck is identified and displayed on the basis of the second model.

10 Claims, 30 Drawing Sheets

(56) References Cited

FOREIGN PATENT DOCUMENTS

JP     2014203359 A  *  10/2014

OTHER PUBLICATIONS

Japanese Office Action dated Oct. 12, 2021 directed to the JP counterpart application No. 2020-141270 with English machine translation.
Japanese Patent Office, Notice of Reasons for Refusal, Application No. JP 2020-141270, dated Mar. 10, 2022, in 6 pages.

* cited by examiner

FIG. 5

TOTAL EXISTENCE PROBABILITY GANTT CHART

| | | 9:00 | 10:00 | 11:00 | 12:00 | 13:00 | 14:00 | 15:00 | 16:00 | 17:00 | 18:00 | 19:00 | 20:00 |
|---|---|---|---|---|---|---|---|---|---|---|---|---|---|
| PROCESSES | PROCESS A | L1:a0 | L2:a0 | L3:a0 | L4:a0 | L5:a5 | | | | | | | |
| | PROCESS B | | L1:a0 | L2:a0 | L3:a0 | L4:a0 | L5:a0 | | | | | | |
| | PROCESS C | | | L1:a1~ | L2:a1~ | L1:a1<br>L3:a1~ | L2:a1<br>L4:a1~ | L3:a1<br>L5:a1~ | L4:a1 | L5:a1 | | | |
| | PROCESS D (WAREHOUSE) | | | | L1:a1~<br>×a2~ | L2:a1~<br>×a2 | L1:a1×a2~<br>L1:a1~×a2<br>L3:a1~×a2~ | L2:a1×a2~<br>L2:a1~×a2<br>L4:a1~×a2~ | L1:a1×a2<br>L3:a1×a2~<br>L3:a1~×a2<br>L5:a1~×a2~ | L2:a2×a2<br>L4:a1×a2~<br>L4:a1~×a2 | L3:a1×a2<br>L5:a1×a2~<br>L5:a1~×a2 | L4:a2<br>×a2 | L5:a2<br>×a2 |
| | REPAIR R1 | | | L1:a1 | L1:a1<br>L2:a1 | L2:a1<br>L3:a1 | L3:a1<br>L4:a1 | L4:a1<br>L5:a1 | L5:a1 | | | | |
| | REPAIR R2 | | | | L1:a1~<br>×a2 | L1:a1~<br>×a2<br>L2:a1~<br>×a2 | L1:a2×a2<br>L2:a1~×a2<br>L3:a1~×a2 | L2:a1×a2<br>L2:a1×a2<br>L3:a1~×a2<br>L4:a1~×a2 | L2:a1×a2<br>L3:a1×a2<br>L4:a1~×a2<br>L5:a1~×a2 | L3:a1×a2<br>L4:a1×a2<br>L5:a1~×a2 | L4:a1×a2<br>L5:a1×a2 | L5:a1<br>×a2 | |

TIME SLOTS a0: NO BRANCHING (100%)
a1: BRANCHING RATE FROM PROCESS B TO REPAIR PROCESS R1
a2: BRANCHING RATE FROM PROCESS C TO REPAIR PROCESS R2

FIG. 6

TOTAL EXISTENCE PROBABILITY GANTT CHART (BY PERCENTAGE)

| | | 9:00 | 10:00 | 11:00 | 12:00 | 13:00 | 14:00 | 15:00 | 16:00 | 17:00 | 18:00 | 19:00 | 20:00 |
|---|---|---|---|---|---|---|---|---|---|---|---|---|---|
| PROCESSES | PROCESS A | L1:100% | L2:100% | L3:100% | L4:100% | L5:100% | | | | | | | |
| | PROCESS B | | L1:100% | L2:100% | L3:100% | L4:100% | L5:100% | | | | | | |
| | PROCESS C | | | L1:60% | L2:60% | L1:40%<br>L3:60% | L2:40%<br>L4:60% | L3:40%<br>L3:60% | L4:40% | L5:40% | | | |
| | PROCESS D (WAREHOUSE) | | | | L1:48% | L2:48% | L1:32%<br>L1:12%<br>L3:48% | L2:32%<br>L2:12%<br>L4:48% | L1:8%<br>L3:32%<br>L3:12%<br>L5:48% | L2:8%<br>L4:32%<br>L4:12% | L3:8%<br>L5:32%<br>L5:32% | | |
| | REPAIR R1 | | | L1:40% | L1:40%<br>L2:40% | L2:40%<br>L3:40% | L3:40%<br>L4:40% | L4:40%<br>L5:40% | L5:40% | | | | |
| | REPAIR R2 | | | | L1:12% | L1:12%<br>L2:12% | L1:8%<br>L2:12%<br>L3:12% | L1:8%<br>L2:8%<br>L3:12%<br>L4:12% | L2:8%<br>L3:8%<br>L4:12%<br>L5:12% | L3:8%<br>L4:8%<br>L5:12% | L4:8%<br>L5:8% | L5:8% | |

TIME SLOTS

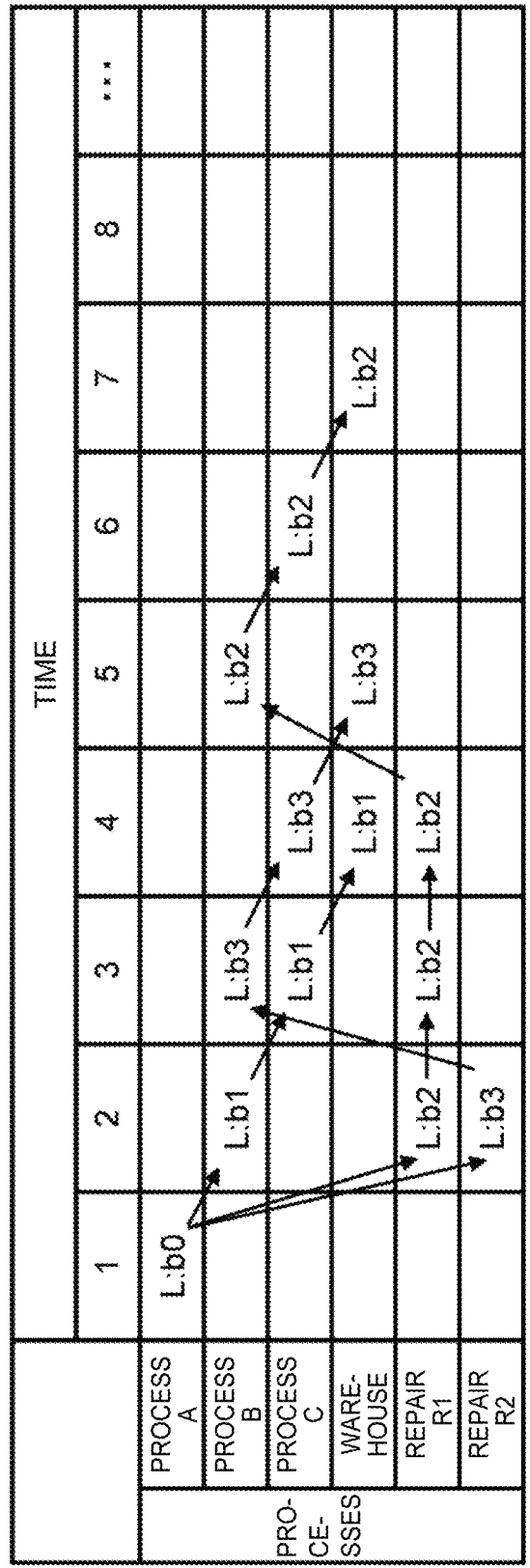

FIG. 10

TOTAL EXISTENCE PROBABILITY GANTT CHART (MIXED ITEMS EXISTENCE CASE)

| PROCESSES | | 9:00 | 10:00 | 11:00 | 12:00 | 13:00 | 14:00 | 15:00 | 16:00 | 17:00 | 18:00 | 19:00 | 20:00 |
|---|---|---|---|---|---|---|---|---|---|---|---|---|---|
| | PROCESS A | L1:a0 | L2:b0 | L3:a0 | L4:b0 | L5:a0 | | | | | | | |
| | PROCESS B | | L1:a0 | L2:b1 | L2:b3<br>L3:a0 | L4:b1 | L2:b2<br>L4:b3<br>L5:a0 | L2:b2<br>L3:a1<br>L4:b3<br>L5:a1~ | L4:b2 | L4:b2<br>L5:a1 | | | |
| | PROCESS C | | | L1:a1~ | L1:a1~<br>L2:b1 | L1:a1<br>L2:b3<br>L3:a1~ | L4:b1 | L4:B1 | | | | | |
| | PROCESS D (WARE-HOUSE) | | | | | L2:b1 | L1:a1×a2~<br>L1:a1~×a2<br>L2:b3<br>L3:a1~×a2~ | L4:B1 | L1:a1×a2<br>L2:b2<br>L3:a1×a2~<br>L3:a1~×a2<br>L4:b3<br>L5:a1~×a2~ | | L3:a1×a2<br>L4:b2<br>L5:a1×a2~<br>L5:a1~×a2 | | |
| | REPAIR R1 | | | L1:a1<br>L2:b2 | L1:a1<br>L2:b2 | L3:a1<br>L2:b2<br>L4:b2 | L3:a1<br>L4:b2 | L5:a1<br>L4:b2 | L5:a1 | | | | |
| | REPAIR R2 | | | L2:b3 | L1:a1~<br>×a2 | L1:a1~<br>×a2<br>L4:b1 | L1:a1<br>×a2<br>L3:a1~<br>×a2 | L1:a1<br>×a2<br>L3:a1~<br>×a2 | L3:a1~<br>×a2 | L3:a1<br>×a2<br>L5:a1~<br>×a2 | L5:a1<br>×a2 | L5:a1<br>×a2 | L5:a1<br>×a2 |

TIME SLOTS

FIG. 11

TOTAL EXISTENCE PROBABILITY GANTT CHART (MIXED ITEMS EXISTENCE CASE BY PERCENTAGE)

| | | 9:00 | 10:00 | 11:00 | 12:00 | 13:00 | 14:00 | 15:00 | 16:00 | 17:00 | 18:00 | 19:00 | 20:00 |
|---|---|---|---|---|---|---|---|---|---|---|---|---|---|
| PROCESSES | PROCESS A | L1:100% | L2:100% | L3:100% | L4:100% | L5:100% | | | | | | | |
| | PROCESS B | | L1:100% | L2:10% | L2:10%<br>L3:100% | L4:10% | L2:80%<br>L4:10%<br>L5:100% | | L4:80% | | | | |
| | PROCESS C | | | L1:60% | L2:10% | L1:40%<br>L2:10%<br>L3:60% | L4:10% | L2:80%<br>L3:40%<br>L4:10%<br>L5:10% | | L4:80%<br>L5:40% | | | |
| | PROCESS D (WAREHOUSE) | | | | L1:60%<br>×80% | L2:10% | L1:40%<br>×20%<br>L1:60%<br>×20%<br>L2:10%<br>L3:60%<br>×80% | L4:10% | L1:40%<br>×20%<br>L2:80%<br>L3:40%<br>×80%<br>L3:60%<br>×20%<br>L4:10%<br>L5:60%<br>×80% | | L3:40%<br>×20%<br>L4:80%<br>L5:40%<br>×80%<br>L5:60%<br>×20% | | L5:40%<br>×20% |
| | REPAIR R1 | | | L1:40%<br>L2:80% | L1:40%<br>L2:80% | L3:40%<br>L2:80%<br>L3:80% | L3:40%<br>L4:80% | L5:40%<br>L5:80% | L5:40% | | | | |
| | REPAIR R2 | | | | L2:10% | L1:60%<br>×20% | L1:60%<br>×20%<br>L4:10% | L1:40%<br>×20%<br>L3:60%<br>×20% | L1:40%<br>×20%<br>L3:60%<br>×20% | L3:40%<br>×20%<br>L5:60%<br>×20% | L5:40%<br>×20% | L5:40%<br>×20% | |

FIG. 12

| HEAT MAP | | 9:00 | 10:00 | 11:00 | 12:00 | 13:00 | 14:00 | 15:00 | 16:00 | 17:00 | 18:00 | 19:00 | 20:00 |
|---|---|---|---|---|---|---|---|---|---|---|---|---|---|
| | | | | | | | TIME SLOTS | | | | | | |
| PROCESSES | PROCESS A | 100% | 100% | 100% | 100% | 100% | | | | | | | |
| | PROCESS B | | 100% | 10% | 110% | 10% | 190% | 190% | 80% | | | | |
| | PROCESS C | | | 60% | 10% | 110% | 10% | 10% | | 120% | | | |
| | PROCESS D | | | | 48% | 10% | 102% | | 162% | | 132% | | 8% |
| | REPAIR R1 | | | 120% | 120% | 200% | 120% | 120% | 40% | | | | |
| | REPAIR R2 | | | 10% | 12% | 22% | 20% | 20% | 20% | 20% | 8% | 8% | |

FIG. 13

TOTAL EXISTENCE PROBABILITY GANTT CHART (MIXED ITEMS EXISTENCE CASE)

| PRO-CE-SSES | TIME SLOTS | 9:00 | 10:00 | 11:00 | 12:00 | 13:00 | 14:00 | 15:00 | 16:00 | 17:00 | 18:00 | 19:00 | 20:00 |
|---|---|---|---|---|---|---|---|---|---|---|---|---|---|
| | PROCESS A | L1:a0 | L2:b0 | L3:a0 | L4:b0 | L5:a0 | | | | | | | |
| | PROCESS B | | L1:a0 | L2:b1 L2:b0 | L2:b3 L3:a0 | L4:b1 | L2:b2 L4:b3 L5:a0 | | L4:b2 | | | | |
| | PROCESS C | | | L1:a1~ | L2:b1 L2:b0 | L1:a1 L1:a0 L2:b3 L3:a1~ | L4:b1 | | | L4:b2 L5:a1 | | | |
| | PROCESS D (WARE-HOUSE) | | | | L1:a1~ ~a2 | L2:b1 L2:b0 | L1:a1~a2 L1:a0~a2 L4:b1~ L2:b3 L3:a1~ | L4:B1 | L1:a1×a2 L2:b2 L3:a1~a2 L4:b3 L5:a1~a2 | | L3:a1×a2 L4:b2 L5:a1~a2 L5:a1~a2 | | L5:a1 ×a2 |
| | REPAIR R1 | | | L1:a1 L1:a0 L2:b2 | L1:a1 L1:a0 L2:b2 | L3:a1 L2:b2 L4:b2 | L3:a1 L4:b2 | L5:a1 L4:b2 | L5:a1 | | | | |
| | REPAIR R2 | | | L2:b3 | L1:a1~ ~a2 | L1:a1~ ~a2 L4:b3 | L1:a1~a2 L1:a0×a2 L3:a1~a2 | L1:a1×a2 L3:a1~a2 | L1:a1×a2 L3:a1~a2 L5:a1~a2 | L3:a1 ×a2 L5:a1~ ×a2 | L5:a1×a2 | L5:a1 ×a2 | |

PROCESS MASTER TABLE 16

| PROCESS NAME | POST-PROCESS | ITEM NAME | WORKING TIME (MINUTES) | USED EQUIPMENT | WORKER |
|---|---|---|---|---|---|
| A | B | K1 | 60 | E01 | W1 |
| B | C | K1 | 60 | E02 | W1 |
| C | D | K1 | 60 | E03 | W1 |
| D | - | K1 | 60 | E04 | W1 |
| B | R1 | K1 | 60 | E02 | W1 |
| C | R2 | K1 | 60 | E03 | W1 |
| R1 | C | K1 | 120 | E11 | W2 |
| R2 | D | K1 | 120 | E12 | W2 |
| A | B | K2 | 60 | E01 | W1 |
| B | C | K2 | 60 | E02 | W1 |
| C | D | K2 | 60 | E03 | W1 |
| D | - | K2 | 60 | E04 | W1 |
| A | R1 | K2 | 60 | E01 | W1 |
| A | R2 | K2 | 60 | E01 | W1 |
| R1 | B | K2 | 180 | E11 | W2 |
| R2 | B | K2 | 60 | E12 | W2 |
| ... | ... | ... | ... | ... | ... |

FIG. 19

BRANCHING RATE MASTER TABLE 17

| PROCESS NAME | POST-PROCESS | ITEM NAME | BRANCHING RATE |
|---|---|---|---|
| A | B | K1 | 100% |
| B | C | K1 | 60% |
| C | D | K1 | 80% |
| D | - | K1 | 100% |
| B | R1 | K1 | 40% |
| C | R2 | K1 | 20% |
| R1 | C | K1 | 100% |
| R2 | D | K1 | 100% |
| A | B | K2 | 10% |
| B | C | K2 | 100% |
| C | D | K2 | 100% |
| D | - | K2 | 100% |
| A | R1 | K2 | 80% |
| A | R2 | K2 | 10% |
| R1 | B | K2 | 100% |
| R2 | B | K2 | 100% |
| ... | ... | ... | ... |
| 17A | 17B | 17C | 17D |

FIG. 20

CURRENT TASK PROGRESS MANAGEMENT TABLE 18

| LOT ID | ITEM NAME | PROCESS NAME | START DATE AND TIME | END DATE AND TIME |
|---|---|---|---|---|
| L1 | K1 | A | 9:00 | 10:00 |
| L2 | K2 | A | 10:00 | 11:00 |
| L1 | K1 | B | 10:00 | 11:00 |
| L3 | K1 | A | 11:00 | 12:00 |
| L2 | K2 | B | 11:00 | 12:00 |
| L1 | K1 | R1 | 11:00 | 12:00 |
| ... | ... | ... | ... | ... |

18A　18B　18C　18D　18E

TASK PROGRESS RESULT INFORMATION MANAGEMENT TABLE 32

PRODUCTION PLAN SUPPORTING APPARATUS AND METHOD

TECHNICAL FIELD

The present invention relates to a production plan supporting apparatus and method is particularly suited for application to a production plan supporting apparatus for a product whose production process has a branch(es).

BACKGROUND ART

Factories are working on improvement activities on a daily basis and various ways of streamlining are being promoted. As one example, a daily production plan is made and processes are made to proceed as planned.

However, in fact, the processes do not often proceed as planned, for example, as a malfunction sometimes occurs in the middle of the processes and some adjustments are made. Therefore, if what kind of malfunctions may occur in which process could be predicted in advance, it would be possible to make the production plan in which appropriate personnel are allocated and facilities are expanded and reinforced.

Incidentally, as a technology for supporting making of the production plan, for example, PTL 1 discloses a process management technology for supporting making of a feasible and shortest process in consideration of limitations on resources.

CITATION LIST

Patent Literature

PTL 1: Japanese Patent Application Laid-Open (Kokai) Publication No. 2014-203359

SUMMARY OF THE INVENTION

Problems to be Solved by the Invention

Various problems dynamically occur at the site of a factory where the situation changes from hour to hour; and an appropriate response is required every time such a problem occurs. For example, as the predetermined production plan cannot satisfactorily deal with the situation, there is a need that the production plan be adjusted from time to time and the allocation of resources such as the personnel and the equipment be optimized.

Therefore, when making the production plan, there is a need for making the plan in consideration of every situation which may possibly happen in the future; however, there are so many factors to be examined and it is difficult to make the production plan in consideration of every situation. For example, the technology disclosed in PTL 1 pays no consideration to the case where the process(es) may branch, so that it is impossible to make the production plan in consideration of the process(es) for which, for example, adjustments may not always happen.

The present invention was devised in consideration of the above-described circumstances and aims at proposing a production plan supporting apparatus and method capable of effectively supporting making of the product plan for a product whose production process has a branch(es).

Means to Solve the Problems

In order to solve the above-described problems, provided according to the present invention is a production plan supporting apparatus for supporting making of a production plan for a product, wherein the production plan supporting apparatus includes: a first processing unit that, when sequentially inputting a work on a production unit basis to a production process in accordance with a predetermined input plan, generates, for respective production units, first models regarding each of which probability of existence of the work in each time slot of each process is calculated, and generates a second model in which all the generated first models for the respective production units are stacked over one another; and a second processing unit that identifies and displays the time slot of the process which will become a bottleneck on the basis of the second model generated by the first processing unit.

Furthermore, provided according to the present invention is a production plan supporting method executed by a production plan supporting apparatus for supporting making of a production plan for a product, wherein the production plan supporting method includes: a first step, which is executed when sequentially inputting a work on a production unit basis to a production process in accordance with a predetermined input plan, of generating, for respective production units, first models regarding each of which probability of existence of the work in each time slot of each process is calculated, and generating a second model in which all the generated first models for the respective production units are stacked over one another; and a second step of identifying and displaying the time slot of the process which will become a bottleneck on the basis of the generated second model.

The production plan supporting apparatus and method according to the present invention can make it easier to make the production plan in consideration of, for example, branches of the production process.

Advantageous Effects of the Invention

The production plan supporting apparatus and method capable of effectively supporting making of the production plan for the product whose production process has a branch (es) can be implemented according to the present invention.

BRIEF DESCRIPTION OF DRAWINGS

FIG. 5 is a diagram illustrating an example of a total existence probability Gantt chart;

FIG. 6 is a diagram illustrating an example of a total existence probability Gantt chart by percentage;

FIG. 9 is a diagram illustrating an example of a branching rate model;

FIG. 10 is a diagram illustrating an example of the total existence probability Gantt chart when products input to the production process are two items;

FIG. 11 is a diagram illustrating an example of the total existence probability Gantt chart by percentage when products input to the production process are two items;

FIG. 12 is a diagram illustrating an example of a heat map for a plurality of types of items;

FIG. 13 is a diagram for explaining changes in the total existence probability Gantt chart with elapse of time;

FIG. 19 is a chart illustrating a structure example of a branching rate master table;

FIG. 20 is a chart illustrating a structure example of a current task progress management table;

DESCRIPTION OF EMBODIMENTS

An embodiment of the present invention will be described below in detail with reference to the drawings.

(1) First Embodiment

(1-1) Principles

Figure 1A:
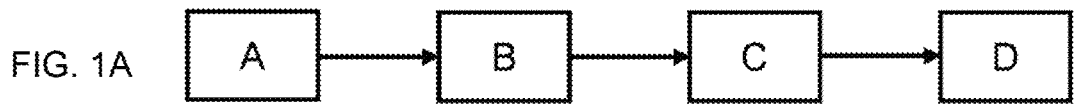
FIG. 1A to FIG. 1C are diagrams illustrating an example of production routes.

Let us assume a case where a product is conducted through four processes "A," "B," "C," and "D" (hereinafter respectively referred to as process A, process B, process C, and process D) as illustrated in FIG. 1A in this order. Process D is, for example, a process to carry the product, which is produced through process A to process C, into a warehouse.

Figure 1B:
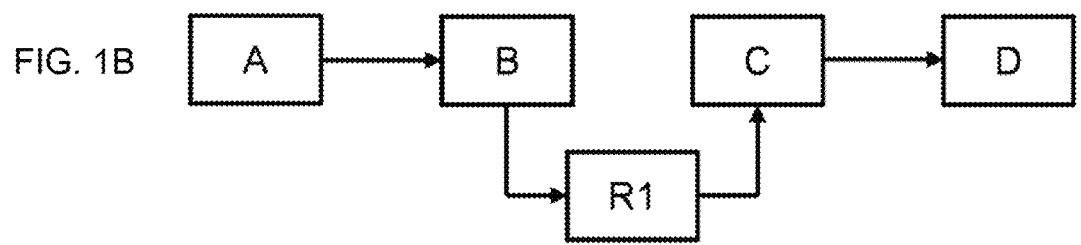
Figure 1C:
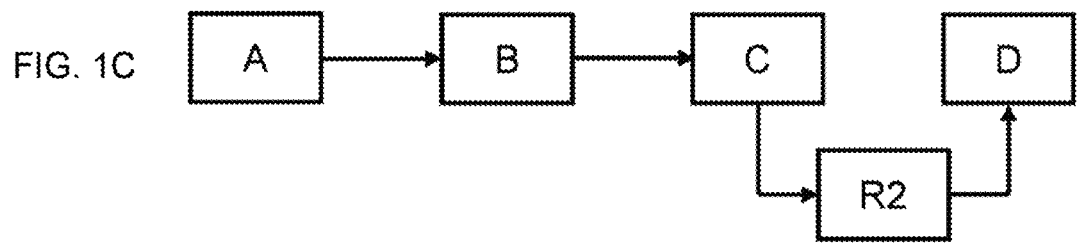

In the following explanation, it is assumed that when a failure occurs in process B, the work proceeds to process C via a process called "R1" to repair the failure as illustrated in FIG. 1B (hereinafter referred to as the repair process R1); and if a failure occurs in process C, the work proceeds to process D via a process called "R2" to repair the failure as illustrated in FIG. 1C (hereinafter referred to as the repair process R2). Furthermore, in the following explanation, a task in the respective processes A to C, R1, and R2 is performed on a lot basis; and process A to process D require 60-minute working time and the repair process R1 and the repair process R2 require 120-minute working time.

Figure 2:
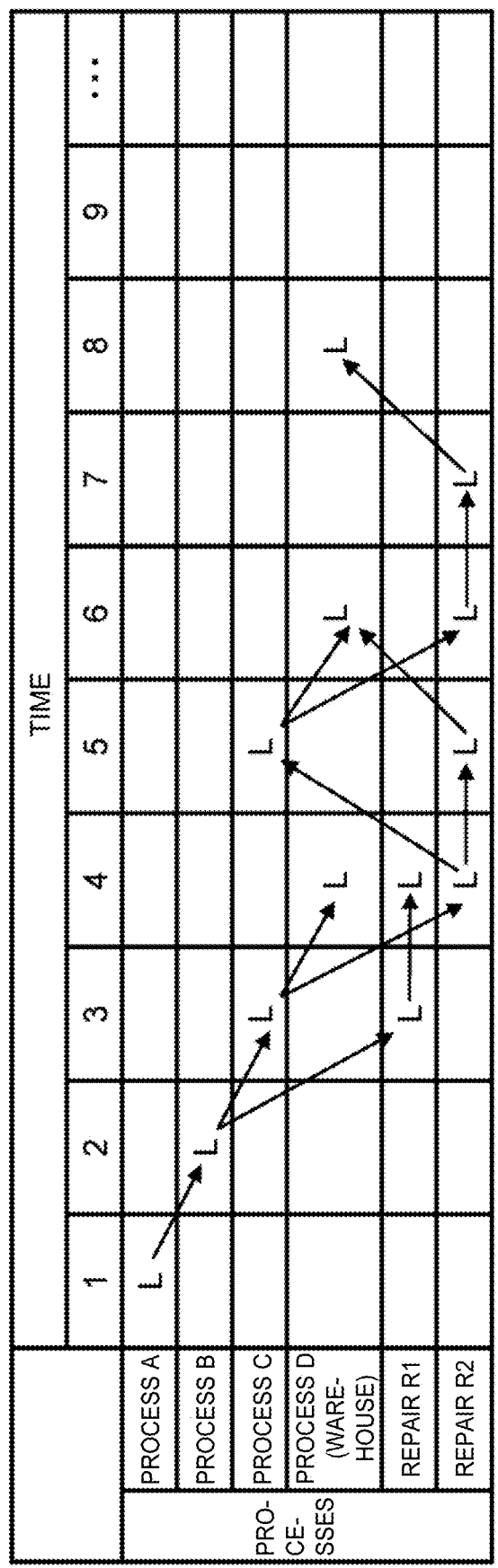
FIG. 2 is a diagram illustrating an example of a production process model.

FIG. 2 illustrates all the respective routes of the production process, which can be anticipated under the above-described conditions and which are stacked one over another. In this drawing, "L" represents that the task is performed on the work of one lot (production unit) in the relevant time slot (each one-hour time slot in this example) of the relevant process. This FIG. 2 shows an example of a case where the work is input to the production process in the time slot "1."

When the failure occurs in process B, the work proceeds to the repair process R1 as described above. So, FIG. 2 shows that after process B ends, a route for the work branches to process C and the repair process R1 as its destinations. Similarly, when the failure occurs in process C, the work proceeds to process D. So, FIG. 2 shows that when process C ends, the work route branches to process D and the repair process R2 at its destinations.

Figure 3:
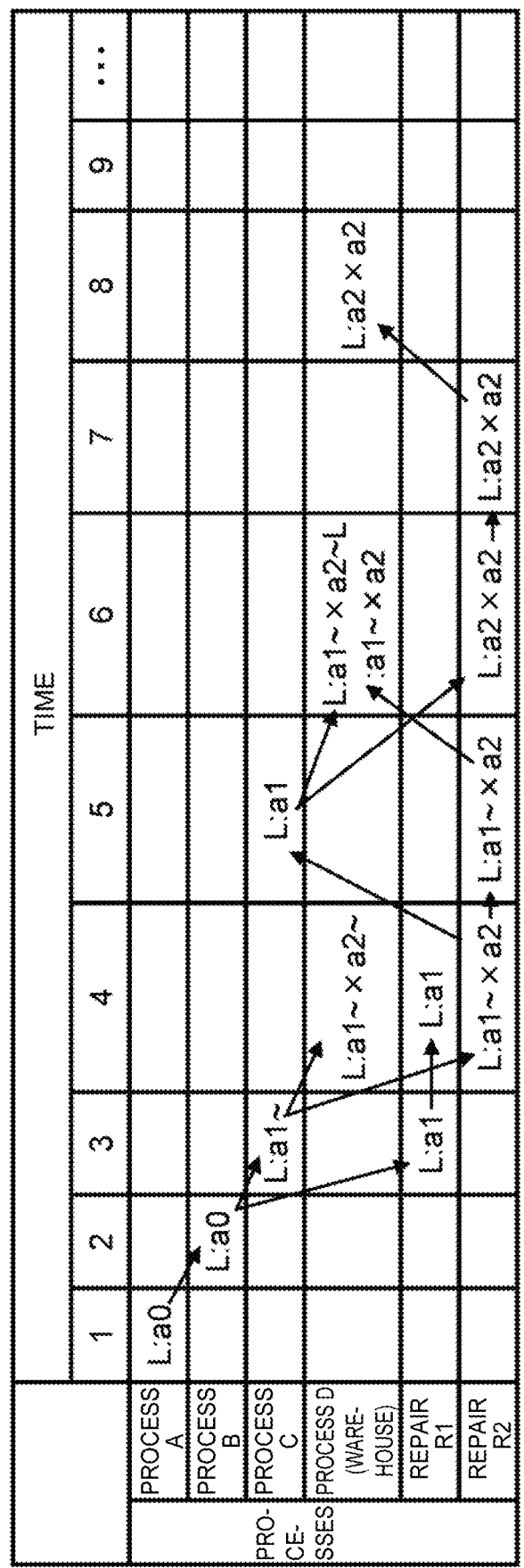
FIG. 3 is a diagram illustrating an example of a branching rate model.

On the other hand, FIG. 3 is a model which represents a rate at which the work route branches from the previous process to each of the next processes (hereinafter referred to as the branching rate) (hereinafter referred to as the branching rate model) in the example of FIG. 2.

Referring to FIG. 3, "a0" represents the branching rate for the work to proceed to the next process when there is no branch in the route from the previous process to the next process. This branching rate is always "100%."

Figure 4:
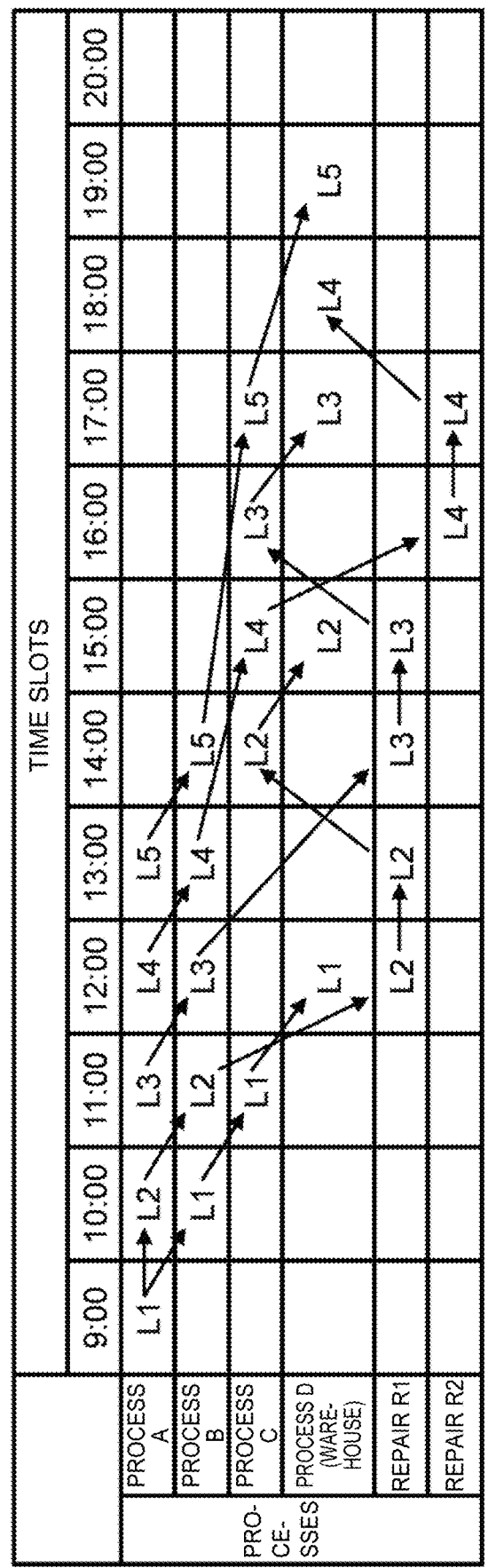
FIG. 4 is a diagram illustrating an actual result example of a production process.

Furthermore, "a1" represents the branching rate for the work to proceed from process B to the repair process R1. This branching rate can be set based on the past actual results. For example, let us assume that the past actual results when works of lot L1 to lot L5 are sequentially input, one lot by one lot, by every unit time (every hour in this example) from the time slot "1" to the production process are in a status as illustrated in FIG. 4. Incidentally, a flow of the process is expressed as "time" in FIG. 2 and FIG. 3; however, the actual results have information about actually worked time, the "time" is expressed as "time slots" in FIG. 4 and specific time starting from "9:00" is assigned to each "time slot" column.

FIG. 4 shows that regarding lot L1, the task proceeds smoothly from process A to process D; however, regarding lot L2 and lot L3, a failure occurs in process B and their routes proceed to the repair process R1. Under this circumstance, lot L3 is in a wait state until the completion of the task of lot L2 in the repair process R1. It is also shown that since a failure occurs in process C, lot L4 proceeds to the repair process R2. Furthermore, regarding lot L5, it is shown that although no failure occurs in either process B or process C, lot L5 is in a wait state until the completion of the tasks of the preceding lots L2 to L4 in process C and process D.

In the case of this example in FIG. 4, the works of lot L3 and lot L4, among five lots from L1 to L5, proceed from process B to the repair process R1 as described above, the rate for proceeding from process B to the repair process R1 is ⅖ and "a1" can be calculated as 40%. Incidentally, "a1" represents a rate of the occurrence of a complementary event regarding "a1⁻" (an event where the task does not proceed from process B to the repair process R1). In the case of the example in FIG. 2, "a1" is 40%, so that "a1⁻" becomes 60%.

Furthermore, "a2" is a branching rate from process C to the repair process R2. This branching rate can also be set based on the past actual results. For example, in the case of the example in FIG. 4, only the work of lot L4 proceeds from process C to the repair process R2, so that the rate for proceeding from process C to the repair process R2 is ⅕ and "a2" can be calculated as 20%. Incidentally, "a2⁻" represents a rate of the occurrence of a complementary event regarding "a2" (an event where the task does not proceed from process B to the repair process R2). In the case of the example in FIG. 4, "a2" is 20%, so that "a2⁻" becomes 80%.

As is obvious from FIG. 3, when the route from the previous process to the next process has no branch, the branching rate to the next process becomes the same as the branching rate calculated with respect to the previous process. Furthermore, when the flow from the previous process to the next process has a branch, the branching rate to the next process can be calculated by multiplying the branching rate to the previous process by the branching rate to the next process. For example, referring to FIG. 3, the branching rate ("a2⁻") of the work for which the task of "process C" in the time slot "5" has finished to proceed to "process D" is 20%, so that the rate at which the work proceeds to "process D" (branching rate) becomes "a1⁻×a2⁻".

Furthermore, referring to FIG. 3, two branching rates "a1⁻×a2⁻" and "a1⁻×a2" are indicated in the time slot "6" of process D and this indicates that: the branching rate of the work to reach process D is "a1⁻×a2⁻" where the work proceeds sequentially from process B, through the repair process R1 and process C, and then to process D; and the branching rate of the work to reach process D is "a1⁻×a2" where the work proceeds sequentially from process B, through process C and the repair process R2, and then to process D.

Under this circumstance, each branching rate indicated in FIG. 3 can be recognized, from another perspective, as probability of the work proceeding through its corresponding route and reaching the process and existing in that process in that time slot (hereinafter referred to as the existence probability). Therefore, in the case of the example in FIG. 3, the existence probability of the work, which was input to the production process in the time slot "1," to exist in process B in the time slot "2" is "a0", the existence probability of the work to exist in process C in the time slot "3" is "a1~"; and the existence probability of the work to exist in the repair process R1 is "a1."

Furthermore, in the case of the example in FIG. 3, the maximum value of the existence probability of the work to exist in process D in the time slot "6" can be calculated as a total value of the branching rate ("a1⁻×a2⁻") at which the work proceeds sequentially from process A, through process B, the repair process R1, and process C, and then to process D, and the branching rate ("a1⁻×a2") at which the work proceeds sequentially from process A, through process B, process C, and the repair process R2, and then to process D.

Accordingly, we can say that each branching rate indicated in FIG. 3 is the probability at which the work exists in the relevant process in the relevant time slot (the existence probability). So, in the following explanation, an explanation will be provided for ease of understanding by stating the "existence probability" instead of the "branching rate" and stating the "existence probability model" instead of the "branching rate model."

FIG. 5 is a Gantt chart generated by stacking existence probability models for the respective lots one over another when the work of one lot (lot L1 to lot L5) was input to the production process every hour in a sequential order from "9:00" (hereinafter referred to as the total existence probability Gantt chart). Each of "L1" to "L5" in the drawing represents the number of the corresponding lot. Further-more, FIG. 6 shows the calculation results of the existence probability of each lot L1 to L5 in each time slot of each process by substituting the branching rate (a1=40%, a1¹⁸=60%, a2=20%, a2⁻=80%) into "a1," "a1⁻," "a2," and "a2⁻," respectively, in FIG. 5.

Referring to FIG. 6, the maximum value of the probability at which the work of any one of lots exists in each time slot of each process (hereinafter referred to as the maximum existence probability) can be calculated as the total value of the existence probabilities of all the lots, each of which may possibly go through each route and reach its process in the relevant time slot. For example, in the case of the example in FIG. 6, the maximum existence probability of the time slot "16:00" of process D can be calculated as 100% as the sum of the existence probability "8%" of lot L1, the existence probability "32%" of lot L3 which went through the repair process R1, the existence probability "12%" of lot L3 which did not go through the repair process R1, and the existence probability "48%" of lot L5.

Figure 7:
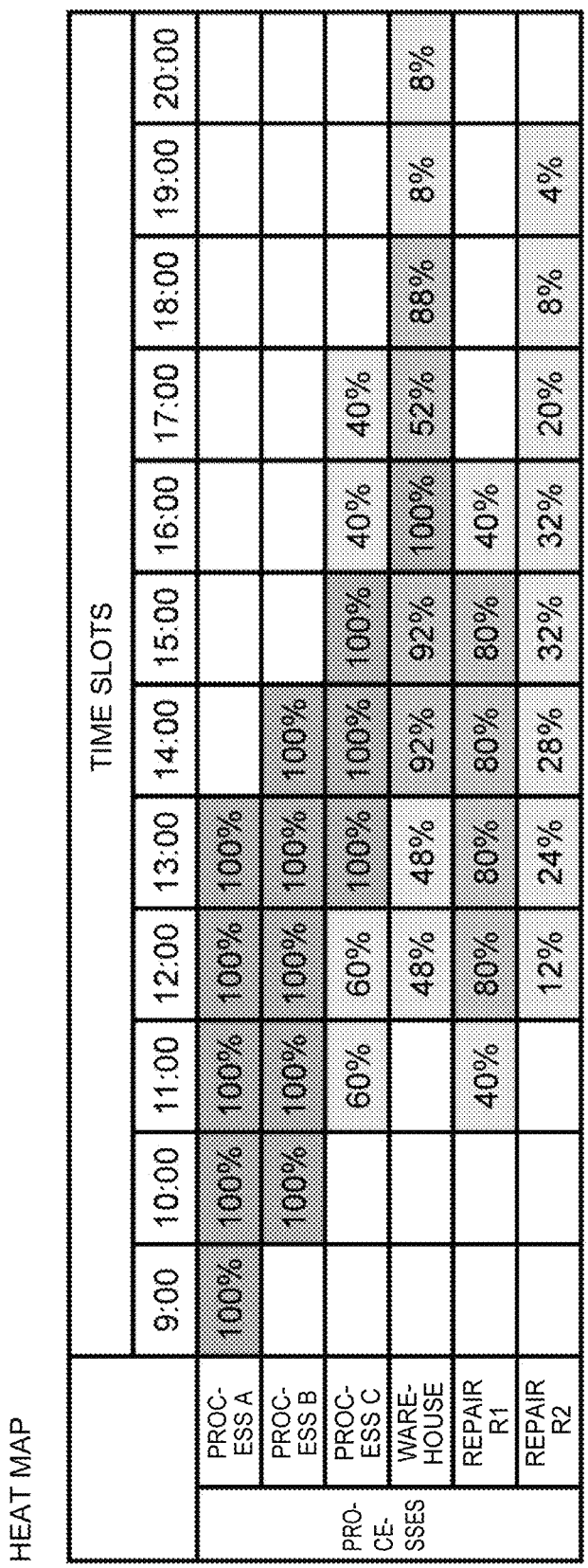
FIG. 7 is a diagram illustrating an example of a heat map for one type of item.

FIG. 7 shows, in a form of a heat map, the maximum existence probability of the work in each time slot of each process in the example of FIG. 6 (that is, in the example where there is one type of item). The maximum existence probability of the work in a certain time slot of a certain process can be calculated as the total value of the existence probabilities of all the lots which may possibly reach that process in that time slot as described above. Then, FIG. 7 shows the thus-calculated maximum existence probabilities of the work in the respective time slots of the respective processes by dividing them into four sections of "0% or more and less than 60%," "60% or more and less than 100%," "100%," and "more than 100%" by color-coding them or coloring them according to densities.

In the example of FIG. 7, the largest value of the maximum existence probabilities of the work in each time slot of each process is "100%." This value of "100%" means that the work of one lot always exists in that time slot of that process. Normally, enough resources such as personnel and equipment to be capable of processing at least one lot within scheduled time are prepared for each process at a factory or the like. So, if the maximum value of the existence probability is "100%," this means that the work can be processed within the specified time (within one hour in the examples of FIG. 1 to FIG. 7) by using the resources prepared for that process in that time slot of that process.

Accordingly, in the case of the examples in FIG. 4 to FIG. 7, even when the works of five lots (lot L1 to lot L5) are sequentially input to the production process every hour from "9:00," you can see that the work of one lot which has passed through the production process can be processed within the specified time (within one hour) and there is no process-and-time-slot combination which would become a bottleneck.

Figure 8A:
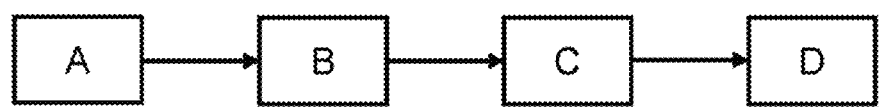
FIG. 8A to FIG. 8C are diagrams illustrating an example of production routes.
Figure 8B:
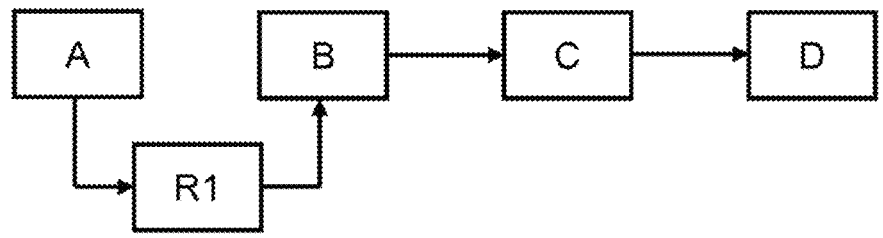
Figure 8C:
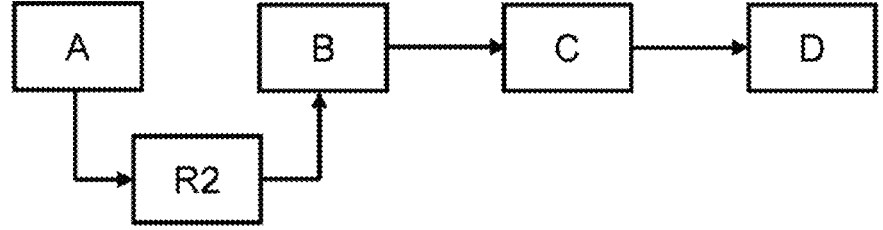

Next, a case where works of two different types of times (items K1 and K2) are input to the aforementioned production process will be examined. In this example, it is assumed that working time for the work of each item K1 or K2 in each process is 60 minutes and the work of the item K1 and the work of the item K2 are input to the production process alternately in one lot every hour. Furthermore, it is assumed that: the item K1 is produced through any one of the three routes described earlier with reference to FIG. 1A to FIG. 1C, and the item K2 is produced through a route as illustrated in FIG. 8A and also in FIG. 8B and FIG. 8C so that if a failure occurs in process A, the route proceeds to the repair process R1 or the repair process R2 depending on the type of that failure, and then returns to process B and goes through subsequent processes.

Since the existence probability model of the work of the item K1 in this case is as explained earlier with reference to FIG. 3, an explanation about it is omitted here. On the other hand, the existence probability model of the item K2 is as illustrated in FIG. 9. Referring to FIG. 9, "b0" represents a branching rate for the work to proceed to the next process when the route from the previous process to the next process has no branch. This branching rate always becomes "100%." Furthermore, "b1" is a branching rate for the work to proceed from process A to process B; "b2" is a branching rate for the work to proceed from process A to the repair process R1, and "b3" is a branching rate for the work to proceed from process A to the repair process R2. The values of these "b1" to "b3" can also be set based on the past actual results. In this example, it is assumed that "b1" is 10%, "b2" is 80%, and "b3" is 10%.

FIG. 10 illustrates a total existence probability Gantt chart when works of products of the two items K1 and K2 of only five lots, one lot at a time, are input to the production process alternately in this sequential order every hour from "9:00." Referring to FIG. 10, "L1" to "L5" represent the lot number of the corresponding lot (lot L1 to lot L5). In this example, "L1," "L3," and "L5" are lots of the work regarding the product of the item K1 "L2" and "L4" are lots of the work regarding the product of the item K2.

Furthermore, FIG. 11 shows the existence probabilities of the respective lots L1 to L5 in the respective time slots of the respective processes, which are calculated by substituting the corresponding branching rates (a1=40%, a1~=60%, a2=20%, a2~=80%, b1=80%, b2=10%) of the examples of FIG. 1 to FIG. 9 in "a1," "a1~," "a2," "a2~," "b1," and "b2" in FIG. 10, respectively. In this example as well, the maximum value of the existence probability of the work in each time slot of each process can be calculated as the total sum of all the existence probabilities indicated in that time slot of that process.

FIG. 12 shows, in the form of a heat map, the maximum existence probabilities of the works of both the items K1 and K2 combined together in each time slot of each process in the example of FIG. 11 (that is, in the example where there are two types of items). FIG. 12 shows, in the same manner as in the case of FIG. 7, the maximum existence probabilities of the works in the respective time slots of the respective processes by dividing them into four sections of "0% or more and less than 60%," "60% or more and less than 100%," "100%," and "more than 100%" by color-coding them or coloring them according to densities.

In the example of FIG. 12, the maximum existence probability of the work in the time slot "12:00" of process B is "110%." "110%" is a value 1.1 times as large as "100%." Therefore, you can see that there is a possibility that the works in an amount 1.1 times, at the maximum, as large as the amount which can be processed within the specified time by the resources prepared in advance (the amount of the works whose maximum existence probability is "100%") may flow into this time slot line of process B; and you can recognize that this may possibly become a bottleneck and disrupt the production.

Therefore, in such a case, it is necessary to review the above-mentioned production plan. Specifically speaking, regarding the process having the time slot for which the maximum existence probability of the work exceeds "100%," it is only necessary to repeat a simulation to shift the timing to input a lot, which has not been input yet to the production process, to the relevant production process by each unit time (for example, an hour in the examples in FIG. 1 to FIG. 12) and determine the timing to input each lot to the production process so that the maximum existence probability of the work becomes "100%" or less with regard to all the time slots of all the processes. Furthermore, it is also possible to deal with the situation by allocating the resources such as the personnel and the equipment in accordance with the maximum existence probability of the work. Accordingly, the user can make the production plan efficiently by providing the user with the heat map like those illustrated in FIG. 7 and FIG. 12. Although "100%" is used in this example, the probability which is designated in advance, such as 80%, may also be designated.

On the other hand, the maximum existence probability of the work in each time slot of each process changes with elapse of time. FIG. 13 is an example of the existence probability model after the elapse of 3 hours (that is, at the point in time at "12:00") when the work of one lot is sequentially input to the production process from "9:00" under the same conditions as those described above with reference to FIG. 9 to FIG. 12.

Referring to this diagram, the existence probability on which a correction line is drawn represents the existence probability which no longer has to be considered because the relevant event did not happen in a stage before the relevant process. Furthermore, a part(s) colored in gray in FIG. 13 represents that the existence probability of the work of any one of the lots in the relevant time slot of the relevant process has changed.

For example, referring to FIG. 13, the work of one lot of the item K2 (the work of lot L2) which was input to the production process at "10:00" proceeds from process A to process B without passing through the repair process R1 or the repair process R2, so that the existence probability of the work in the time slot "11:00" of process B and in the subsequent related time slots and processes changes from "b1" to "b0" which represents the existence probability 100%. Furthermore, referring to FIG. 13, regarding the work of one lot of the item K1 (the work of lot L1) which was input to the production process at "9:00," a failure occurs in the time slot "10:00" of process B and, therefore, the work is sent to the repair process R1 at the stage of "12:00" and it becomes no longer necessary to consider, regarding the existence probability, the case where the work is sent to process C after process B; and as a result, the related existence probabilities are changed or deleted.

Figure 14:
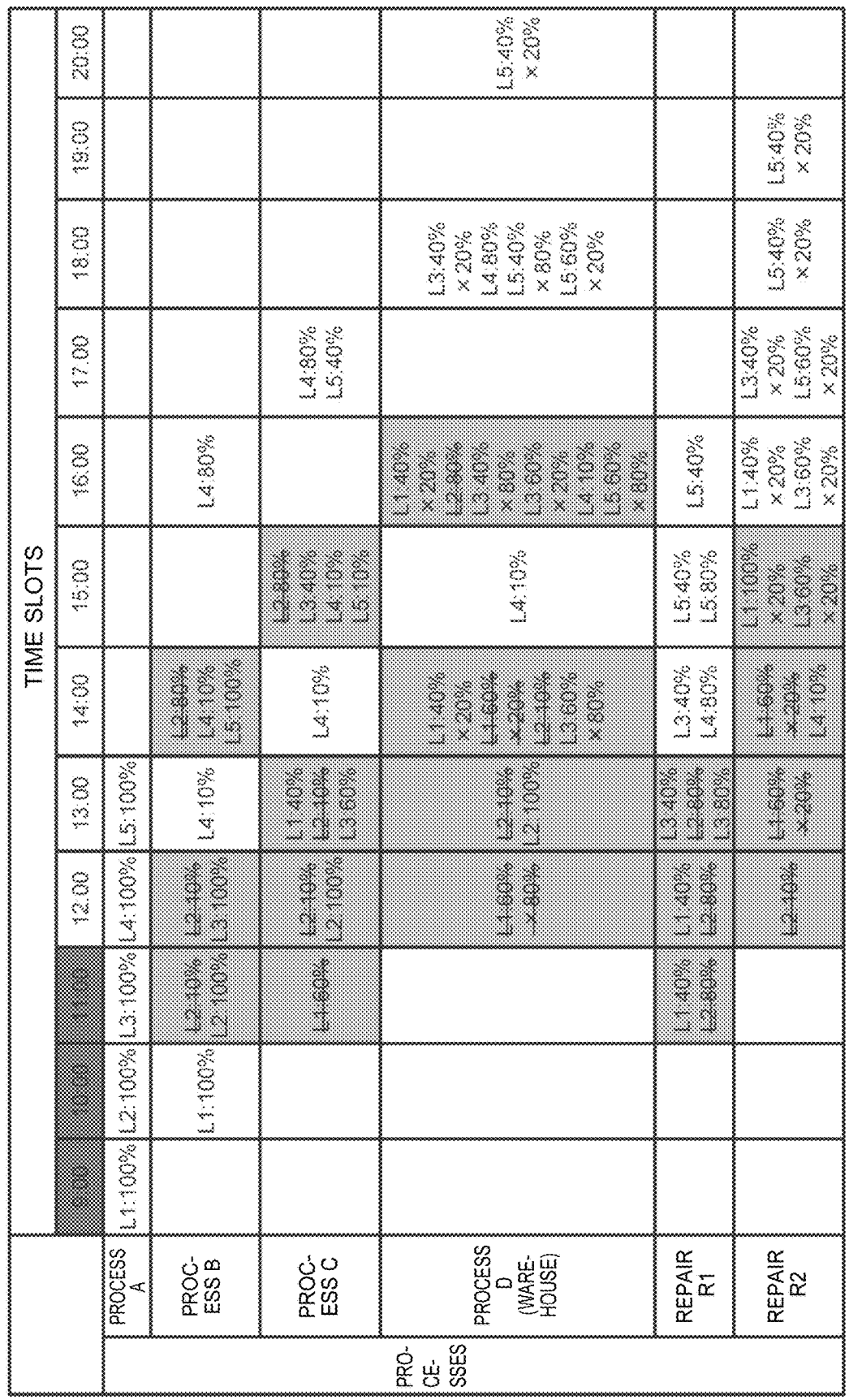
FIG. 14 is a diagram for explaining changes in the total existence probability Gantt chart with elapse of time.

FIG. 14 shows the existence probabilities of the respective lots L1 to L5 in the respective time slots of the respective processes, which are calculated by substituting the aforementioned corresponding branching rates (a1=40%, a1~=60%, a2=20%, a2~=80%, b1=80%, b2=10%) in "a1," "a1~," "a2," "a2~," "b1," and "b2" in FIG. 13, respectively. A part(s) colored in gray in FIG. 14 represents that the existence probability of the work of any one of the lots in the relevant time slot of the relevant process has changed.

Figure 15:
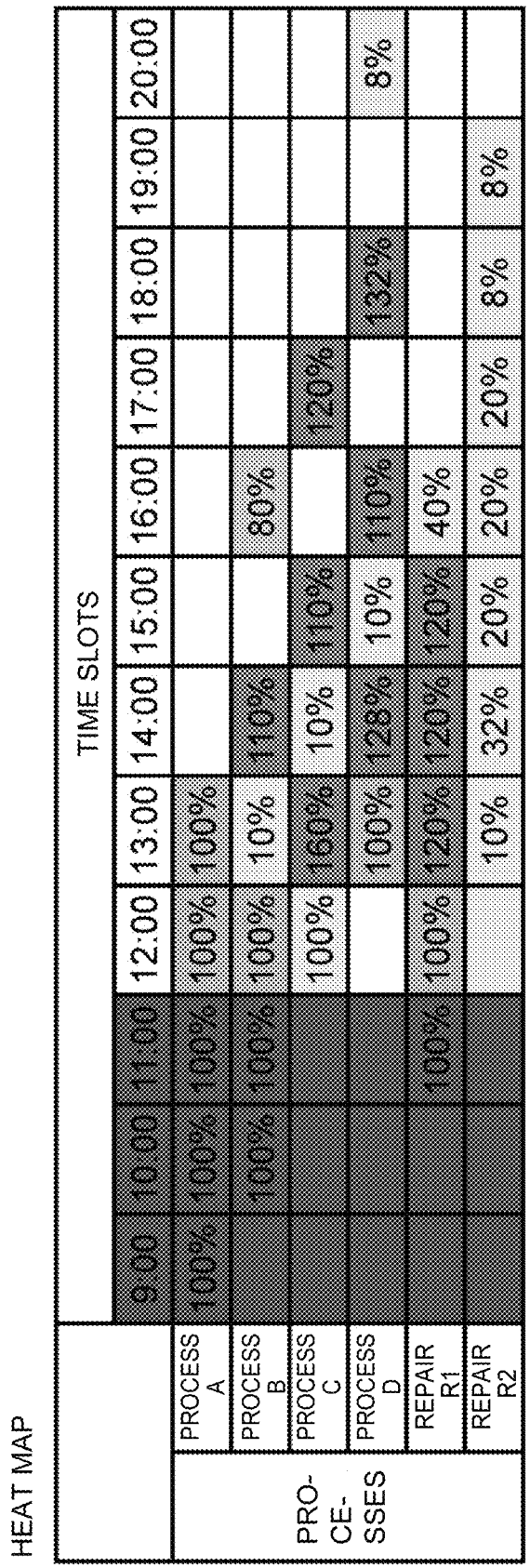
FIG. 15 is a diagram for explaining changes in the heat map with elapse of time.

Furthermore, FIG. 15 shows, in the form of a heat map in the same manner as in FIG. 12, the maximum existence probability of the work in each time slot of each process in the example of FIG. 14. FIG. 15 shows, in the same manner as in the case of FIG. 12, the maximum existence probabilities of the work in the respective time slots of the respective processes by dividing them into four sections of "0% or more and less than 60%," "60% or more and less than 100%," "100%," and "more than 100%" by color-coding them or coloring them according to densities.

As is obvious from FIG. 15, the existence probabilities in some time slots of some processes have changed with respect to the maximum existence probabilities of the work in the respective time slots of the respective processes as described in the heat map created at and before "10:00" indicated in the drawing (in the time slot "9:00" or before then). For example, in the heat map created at and before "10:00" (as in the drawing), the maximum existence probability of any one of the works in the time slot "13:00" of process C was "110%"; however, in the heat map created at "12:00" (as in the drawing), the maximum existence probability of any one of the works in the time slot "13:00" of process C changed to "160%."

Accordingly, in such a case, it is only necessary to change the allocation of the resources such as the personnel and the equipment, repeat the simulation by shifting the timing to input the lot(s) to the production process at and after "12:00" by each unit time (for example, an hour in the examples of FIG. 1 to FIG. 15), and determine the timing to input each lot to the production process after then so that the maximum existence probabilities of the work in all the time slots of all the processes become equal to or less than "100%" or other preset existence probabilities. Accordingly, it becomes possible to produce the product always based on the appropriate production plan by making the production plan as described above.

(1-2) Configuration of Production Plan Supporting System According to First Embodiment

(1-2-1) Configuration of Production Plan Supporting System

Figure 16:
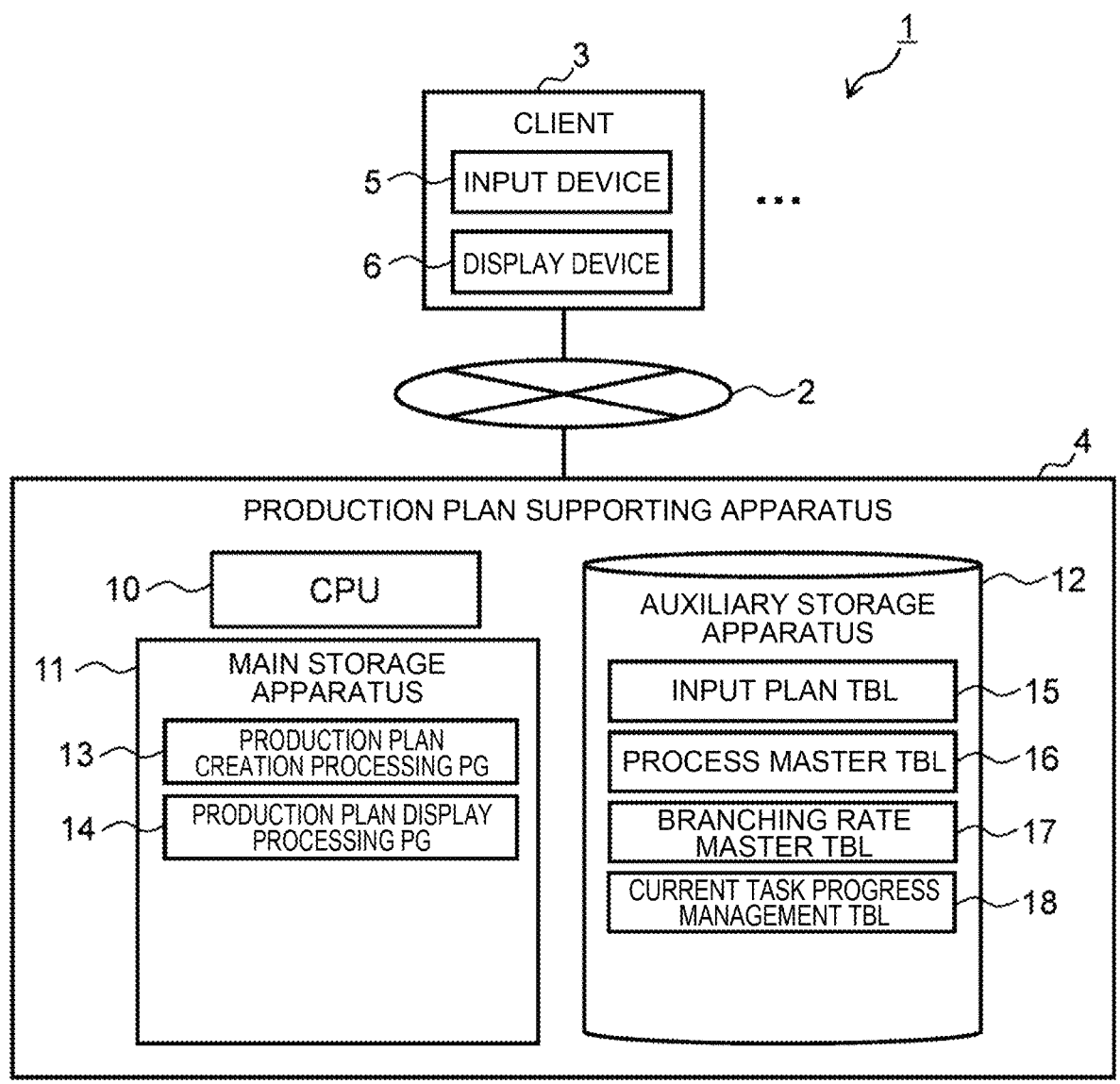
FIG. 16 is a block diagram illustrating an overall configuration of a production plan supporting system according to a first embodiment.

Referring to FIG. 16, the reference numeral 1 generally represents a production plan supporting system according to this embodiment. This production plan supporting system 1 is configured by including one or more clients 3 coupled to each other via a network 2, and a production plan supporting apparatus 4.

The client 3 is a computer device used by a user and includes, besides an input device 5 and a display device 6, information processing resources such as a CPU (Central Processing Unit) which is not illustrated in the drawing, a main storage apparatus, and an auxiliary storage apparatus.

The input device 5 is composed of a keyboard, a mouse, a touch panel, and so on and is used by the user to input various kinds of instructions to the production plan supporting apparatus 4 and input various kinds of necessary conditions for the production plan supporting apparatus 4 to provide information to support making of the production plan.

Furthermore, the display device 6 is composed of a liquid crystal display or an organic EL (Electro Luminescence) display and is used to display a GUI (Graphical User Interface) for the production plan supporting apparatus 4 to input various kinds of conditions for making the production plan, and various kinds of screens to display information calculated by the production plan supporting apparatus 4.

The production plan supporting apparatus 4 is composed of a general-purpose server apparatus including a CPU 10, a main storage apparatus 11, and an auxiliary storage apparatus 12. The CPU 10 is a processor that controls the operation of the entire production plan supporting apparatus 4. Furthermore, the main storage apparatus 11 is composed of, for example, a volatile semiconductor memory and is used as a work memory for the CPU 10. A production plan creation processing program 13 and a production plan display processing program 14 which will be described later are stored and retained in this main storage apparatus 11.

The auxiliary storage apparatus 12 is composed of hard disk drives and large-capacity nonvolatile storage devices such as SSD's (Solid State Drives) and is used to retain various kinds of programs and control information for a long period of time. The respective programs including the production plan creation processing program 13 and the production plan display processing program 14 which are stored in the auxiliary storage apparatus 12 are loaded onto the main storage apparatus 11 when activating the production plan supporting apparatus 4 or whenever necessary; and various kinds of processing as the production plan supporting apparatus 4 as a whole as described later is executed by the CPU 10 executing the programs loaded onto the main storage apparatus 11. An input plan table 15, a process master table 16, a branching rate master table 17, and a current task progress management table 18 which will be described later are stored and retained in this auxiliary storage apparatus 12.

(1-2-2) Production Plan Supporting Function

Next, a production plan supporting function loaded on the production plan supporting apparatus 4 will be explained. This production plan supporting function: generates the total existence probability Gantt chart, which was described earlier with reference to FIG. 5 and FIG. 10, on the basis of the input plan to input each lot, which is registered by the user in advance, to the production process with respect to one or more types of items, all routes for the work(s) which can be estimated in advance, and the branching rates to the respective branch destinations at branching points in the respective routes, which are set by the user in advance; and presents the heat map, which was described earlier with reference to FIG. 7 and FIG. 12, to the user on the basis of the generated total existence probability Gantt chart. Furthermore, the production plan supporting apparatus 4 updates the heat map to the content according to the situation at that time in response to a request from the user on the basis of the above-described production plan supporting function, makes the production plan regarding which no bottleneck will occur, and presents the made production plan to the user.

As means for implementing such a production plan supporting function, the production plan supporting apparatus 4 retains the input plan table 15, the process master table 16, the branching rate master table 17, and the current task progress management table 18 in the auxiliary storage apparatus 12 and also retains the production plan creation processing program 13 and the production plan display processing program 14 in the main storage apparatus 11.

Figure 17:
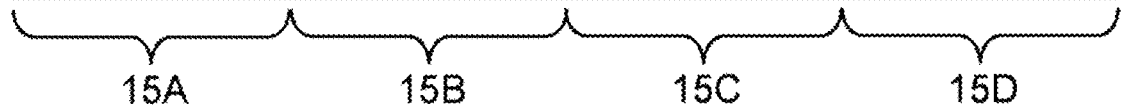
FIG. 17 is a chart illustrating a structure example of an input plan table.

The input plan table 15 is a table used to manage the input plan to input each lot to the production process and is created by the user in advance. The input plan table 15 is configured as illustrated in FIG. 17 by including an item name column 15A, a lot ID column 15B, a number-of-works column 15C, and a scheduled input time column 15D. One row of the input plan table 15 corresponds to one lot scheduled to be input to the production process.

Then, the item name column 15A stores the item name of a product to be manufactured at that time. Furthermore, the lot ID column 15B stores a unique identifier (lot ID) of the relevant lot, which is assigned to that lot to be input to the production process; and the number-of-works column 15C stores the number of works in the relevant lot. Furthermore, the scheduled input time column 15D stores scheduled time of day to input the relevant lot to the production process.

Therefore, in the case of the example in FIG. 17, it is shown that the item name of the product to be manufactured at that time is "K1"; and there are five lots with their lot ID's "L01" to "L05" to be input to the production process; and these fives lots are scheduled to be sequentially input to the production process every hour from "9:00" in an ascending order of their lot ID's. Furthermore, FIG. 17 also shows that the number of works in each lot is "100" pieces.

Figure 18:
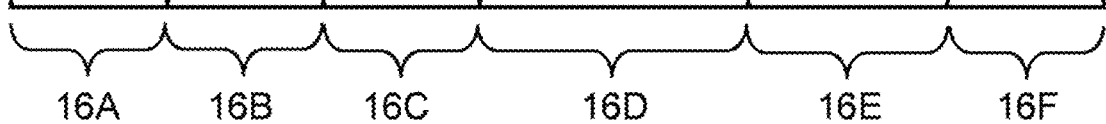
FIG. 18 is a chart illustrating a structure example of a process master table.

The process master table 16 is a table used to manage all the routes for the production process and is created by the user in advance. This process master table 16 is configured as illustrated in FIG. 18 by including a process name column 16A, a post-process column 16B, an item name column 16C, a working time column 16D, a used equipment column 16E, and a worker column 16F. One row of the process master table 16 corresponds to a route from one process to the next process within each route (hereinafter referred to as the inter-process route).

Then, the process name column 16A stores the process name of a former process in the relevant inter-process route; and the post-process column 16B stores the process name of a latter process in the relevant inter-process route. Incidentally, the post-process column 16B corresponding to the last process in each route stores "-" which means that no value exists. Furthermore, the item name column 16C stores the item name of the work which goes through the relevant inter-process route.

Furthermore, the working time column 16D stores working time required for the former process in the relevant inter-process route; and the used equipment column 16E stores a unique identifier of equipment used for the relevant former process (equipment ID). Furthermore, the worker column 16F stores a unique identifier of a worker in charge of the relevant former process (worker ID).

Therefore, in the case of the example in FIG. 18, by using the information registered in the process master table 16, you can see that, for example, as routes for the product with the item name "K1," there are a first route which goes through the respective processes "A" to "D" in this sequential order, a second route which goes through the respective processes "A," "B," "R1," "C," and "D" in this sequential order, and a third route which goes through the respective processes "A," "B," "C," "R2," and "D" in this sequential order.

FIG. 18 also shows that the working time of each process of "A" to "D" is "60" minutes and the working time of each process of "R1" and "R2" is "120" minutes. Furthermore, FIG. 18 shows that the equipment used in the respective processes of "A" to "D" is "E01," "E02," "E03," and "E04" and the worker for each of these processes is "W1"; and the equipment used in the respective processes of "R1" and "R2" is "E11" and "E12" and the worker for each of these processes is "W2."

The branching rate master table 17 is a table used to manage each branching rate from the former process to the latter process in each inter-process route registered in the process master table 16 and is created by the user in advance on the basis of the past actual results. This branching rate master table 17 is configured as illustrated in FIG. 19 by including a process name column 17A, a post-process column 17B, an item name column 17C, and a branching rate column 17D. One row of the branching rate master table 17 corresponds to one inter-process route among all the routes for the production task.

Then, the process name column 17A, the post-process column 17B, and the item name column 17C store the same information as the information stored in the process name column 16A, the post-process column 16B, and the item name column 16C of the process master table 16 (FIG. 18), respectively. Furthermore, the branching rate column 17D stores the branching rate of the lot flowing from the former process to the latter process in the relevant inter-process route.

Therefore, in the case of the example in FIG. 19, it is shown that, for example, the branching rate of the lot flowing from the process "A" to the process "B" is "100%." FIG. 19 also shows the branching rate of the lot flowing from the process "B" to the process "C" is "60%" and the branching rate of the lot flowing from the process "B" to the process "R1" is "40%."

The current task progress management table 18 is a table used to manage the actual result information of the task progress of a production task which is being performed in the production process and is configured as illustrated in FIG. 20 by including a lot ID column 18A, an item name column 18B, a process name column 18C, a start date and time column 18D, and an end date and time column 18E. One row of the current task progress management table 18 corresponds to an actual result of one process completed in the current production task; and every time when one process for one lot is finished, new actual result information is sequentially stored by storing necessary information in the top unused row.

Then, the lot ID column 18A stores the lot ID of a lot which has already been input to the production process regarding that production task; and the item name column 18B stores the item name of the product of that lot. Furthermore, the process name column 18C stores the process name of the process regarding which the task for the relevant lot has already been completed. Furthermore, the start date and time column 18D stores time of day when the task for the relevant process was started; and the end date and time column 18E stores time of day when the task for the relevant process ended.

Therefore, in the case of the example in FIG. 20, it is disclosed that, for example, the lot with the lot ID "L1" was input to the production process at "9:00," went through the respective processes "A" and "B," and then completed the process "D" at "11:00."

Meanwhile, the production plan creation processing program 13 is a program having a function that generates and updates the total existence probability Gantt chart described earlier with reference to FIG. 6 and FIG. 11 and makes the production plan, regarding which no bottleneck will occur, in response to a request from the user.

Practically, the production plan creation processing program 13 generates the total existence probability Gantt chart described earlier with reference to FIG. 6 and FIG. 11, on the basis of the information stored in the input plan table 15 (FIG. 17), the process master table 16 (FIG. 18), and the branching rate master table 17 (FIG. 19), respectively.

Furthermore, when a request is made to update the heat map after the work of the first lot is input to the production process, the production plan creation processing program 13 recalculates the existence probabilities of the work in subsequent time slots of the respective processes on the basis of the progress of the production task which has been registered in the current task progress management table 18 (FIG. 20) until that point in time, thereby updating the total existence probability Gantt chart described earlier with reference to FIG. 6 and FIG. 11.

Furthermore, when receiving a request from the user to make the production plan regarding which no bottleneck will occur, the production plan creation processing program 13 repeats the simulation to create the total existence probability Gantt chart as the time of day to input some or all the lots of the respective lots, which have not been input to the production process at that time, to the production process is shifted by each unit time. Then, the production plan creation processing program 13: determines the timing to input each lot to the production process so that the maximum existence probabilities of the work in all the time slots of all the processes become equal to or less than "100%" or other preset existence probabilities; and generates the total existence probability Gantt chart in accordance with the determination results.

Furthermore, the production plan display processing program 14 is a program having a function that: generates a bottleneck process prediction screen, in a heat map form, indicating a process which will become a bottleneck as predicted based on the total existence probability Gantt chart created by the production plan creation processing program 13; and causes the client 3 to display the bottleneck process prediction screen (FIG. 16).

Practically, the production plan display processing program 14 generates the heat map described earlier with reference to FIG. 7 and FIG. 12 based on the total existence probability Gantt chart created by the production plan creation processing program 13 and generates the bottleneck process prediction screen on which the generated heat map is posted. Then, the production plan display processing program 14 transmits screen data of the thus-generated bottleneck process prediction screen to the requested client 3, thereby causing the client 3 to display the bottleneck process prediction screen.

Figure 21:
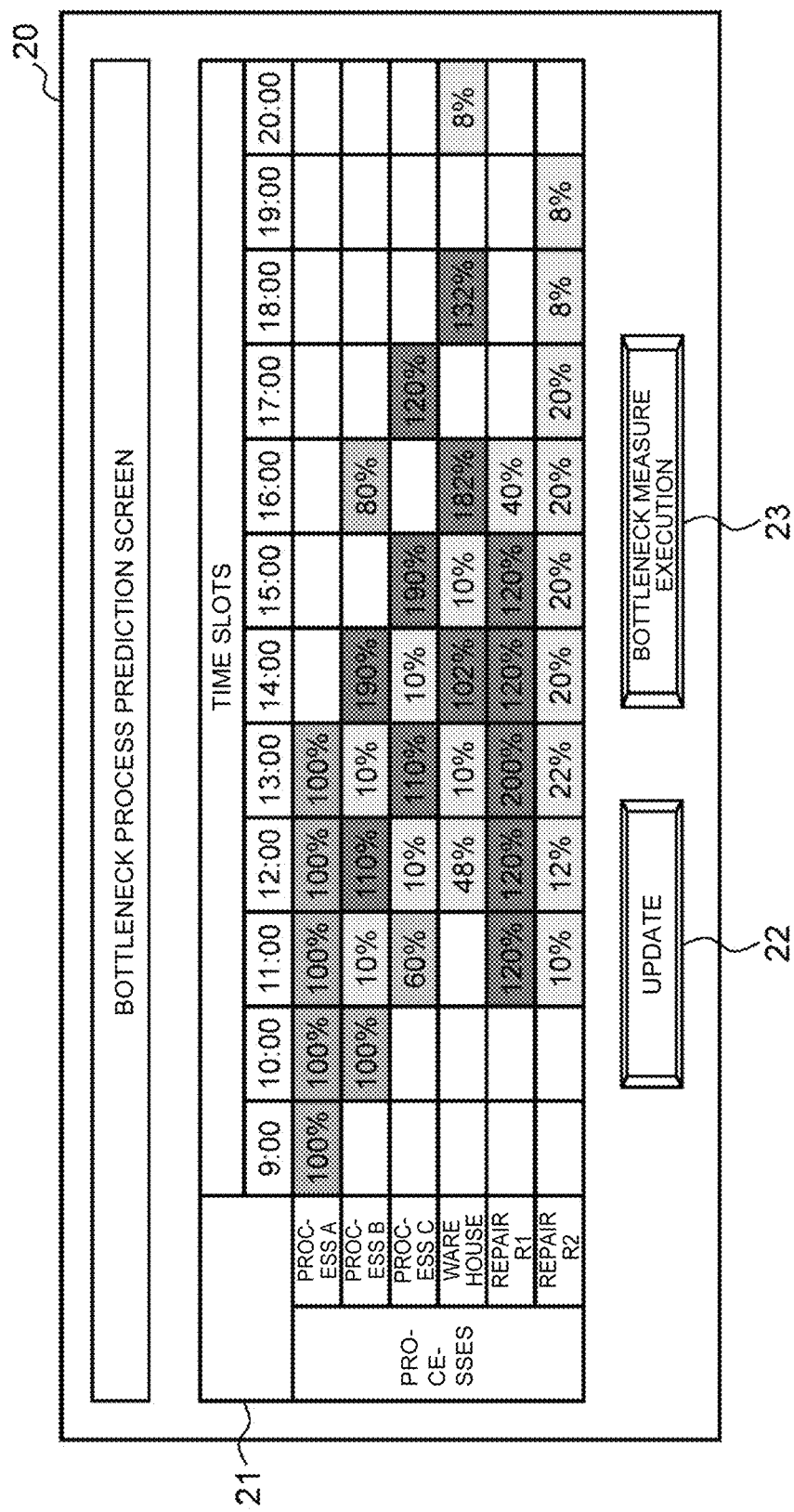
FIG. 21 is a diagram illustrating a structure example of a bottleneck process prediction screen.

Incidentally, a structure example of the above-described bottleneck process prediction screen is illustrated in FIG. 21. A bottleneck process prediction screen 20 illustrated in this FIG. 21 is configured by including a heat map display area 21, an update button 22, and a bottleneck measure execution button 23. Then, the heat map created by the production plan creation processing program 13 is displayed in the heat map display area 21 as described above.

Furthermore, the heat map displayed in the heat map display area 21 can be updated to the content according to the current status by clicking on the update button 22 on the bottleneck process prediction screen 20. For example, if the original heat map is in a state illustrated in FIG. 12, this is updated to the heat map with the content according to the status at the point in time at the current time "12:00" as illustrated in FIG. 15.

Furthermore, with the bottleneck process prediction screen 20, the production plan regarding which no bottleneck will occur can be made and the heat map in a case where the production plan is followed can be displayed in the heat map display area 21 by clicking on the bottleneck measure execution button 23. For example, when the heat map displayed in the heat map display area 21 on the original bottleneck process prediction screen 20 is as illustrated in FIG. 12, for example, the heat map based on the production plan which is adjusted as illustrated in FIG. 22 by, for example, shifting the time to input some works to the production process so that the existence probabilities of the works in all the processes and all the time slots become "100%" or less is displayed in the heat map display area 21.

Figure 22:
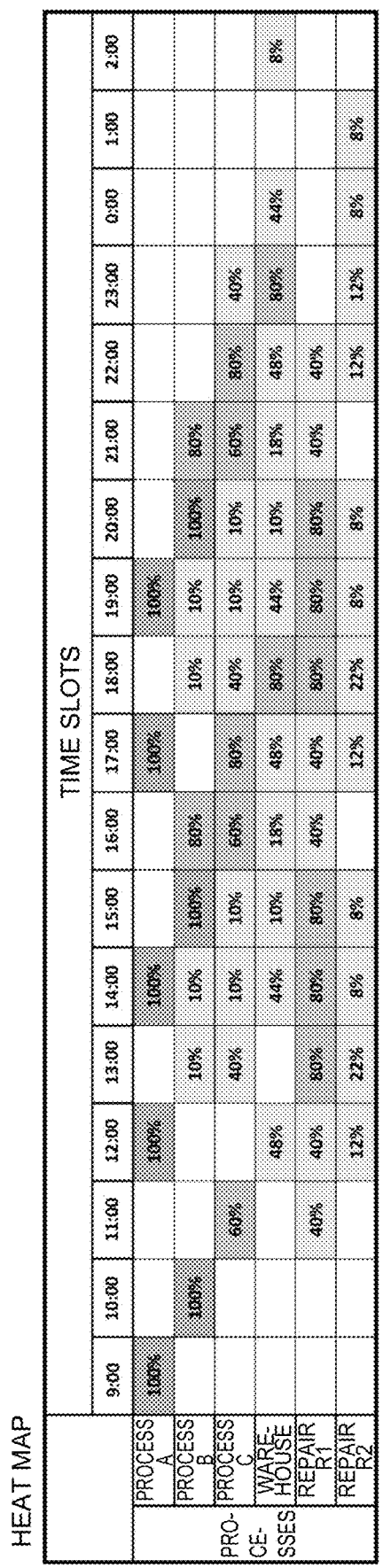
FIG. 22 is a diagram illustrating an example of a heat map according to a made production plan.

Incidentally, the example in FIG. 22 is an example of a case where the production plan is made so that: the time to input the second work (the work L2) to the production process is shifted from the original schedule of "10:00" to "12:00"; the time to input the third work (L3) to the production process is shifted from the original schedule of "11:00" to "14:00"; the time to input the fourth work (L4) to the production process is shifted from the original schedule of "12:00" to "17:00"; and the time to input the fifth work (L5) to the production process is shifted from the original schedule of "13:00" to "19:00."

(1-3) Various Types of Processing Relating to Production Plan Supporting Function Next, specific processing content of various types of processing executed by the production plan creation processing program 13 and the production plan display processing program 14 in relation to the production plan supporting function will be explained. Incidentally, in the following explanation, a processing subject of the various types of processing will be explained as a "program"; however, needless to say, the CPU 10 (FIG. 16) actually executes the processing based on that program.

(1-3-1) Production Plan Supporting Processing

Figure 23:
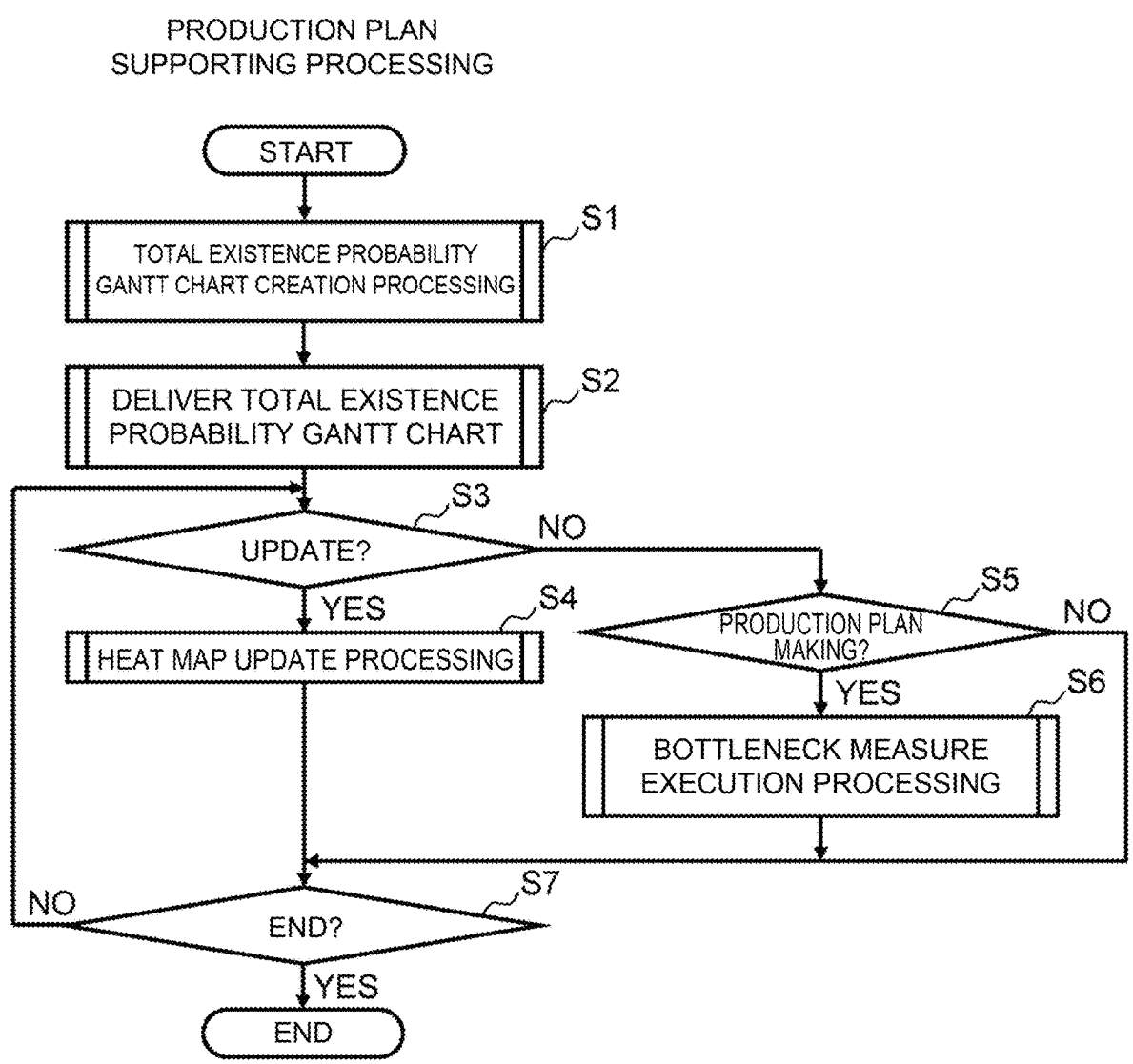
FIG. 23 is a flowchart illustrating a processing sequence for production plan supporting processing.

FIG. 23 illustrates a processing sequence for production plan supporting processing executed by the production plan creation processing program 13 in relation to the above-described production plan supporting function.

When the user operates their own client 3 to request that the bottleneck process prediction screen 20 described above with reference to FIG. 21 be displayed, the production plan creation processing program 13 starts the production plan supporting processing illustrated in this FIG. 21 and firstly generates the total existence probability Gantt chart described earlier with reference to FIG. 6 and FIG. 11 based on the input plan table 15, the process master table 16, and the branching rate master table 17 (S1).

Next, the production plan creation processing program 13 delivers data of the created total existence probability Gantt chart to the production plan display processing program 14 (S2). As a result, the production plan display processing program 14 generates the heat map described earlier with reference to FIG. 7 and FIG. 12 based on this total existence probability Gantt chart, generates screen data of the bottleneck process prediction screen 20 (FIG. 21) on which the generated heat map is posted, and transmits the generated screen data to the client 3. Accordingly, the bottleneck process prediction screen 20 based on this screen data is displayed on the client 3.

Subsequently, the production plan creation processing program 13 sequentially judges whether either one of the update button 22 or the bottleneck measure execution button 23 in the bottleneck process prediction screen 20 displayed on the client 3 is clicked or not (S3, S5). Then, if neither the update button 22 nor the bottleneck measure execution button 23 is clicked, the production plan creation processing program 13 judges whether or not the user has performed specified operation to close the bottleneck process prediction screen 20 (S7). Then, if the production plan creation processing program 13 obtains a negative result in this judgment, it returns to step S3 and then repeats a loop of step S3, step S5, step S7, and step S3 until it obtains an affirmative result in any one of step S3, step S5, and step S7.

Then, when the production plan creation processing program 13 eventually detects that the update button 22 on the bottleneck process prediction screen 20 is clicked, it executes heat map update processing for updating the heat map displayed on the bottleneck process prediction screen 20 to the content according to the current status (S4), and then proceeds to step S7.

On the other hand, when the production plan creation processing program 13 detects that the bottleneck measure execution button 23 on the bottleneck process prediction screen 20 is clicked, it executes bottleneck measure execution processing for creating the total existence probability Gantt chart in which the timing to input each lot, which has not been input to the production process, to the production process is determined so that the maximum existence probabilities of the works in all the time slots of all the processes become equal to or less than "100%" or other preset existence probabilities (S6). Subsequently, the production plan creation processing program 13 proceeds to step S7.

Then, when the production plan creation processing program 13 eventually detects that the specified operation to close the bottleneck process prediction screen 20 is performed, it terminates this production plan supporting processing.

(1-3-2) Total Existence Probability Gantt Chart Creation Processing

Figure 24:
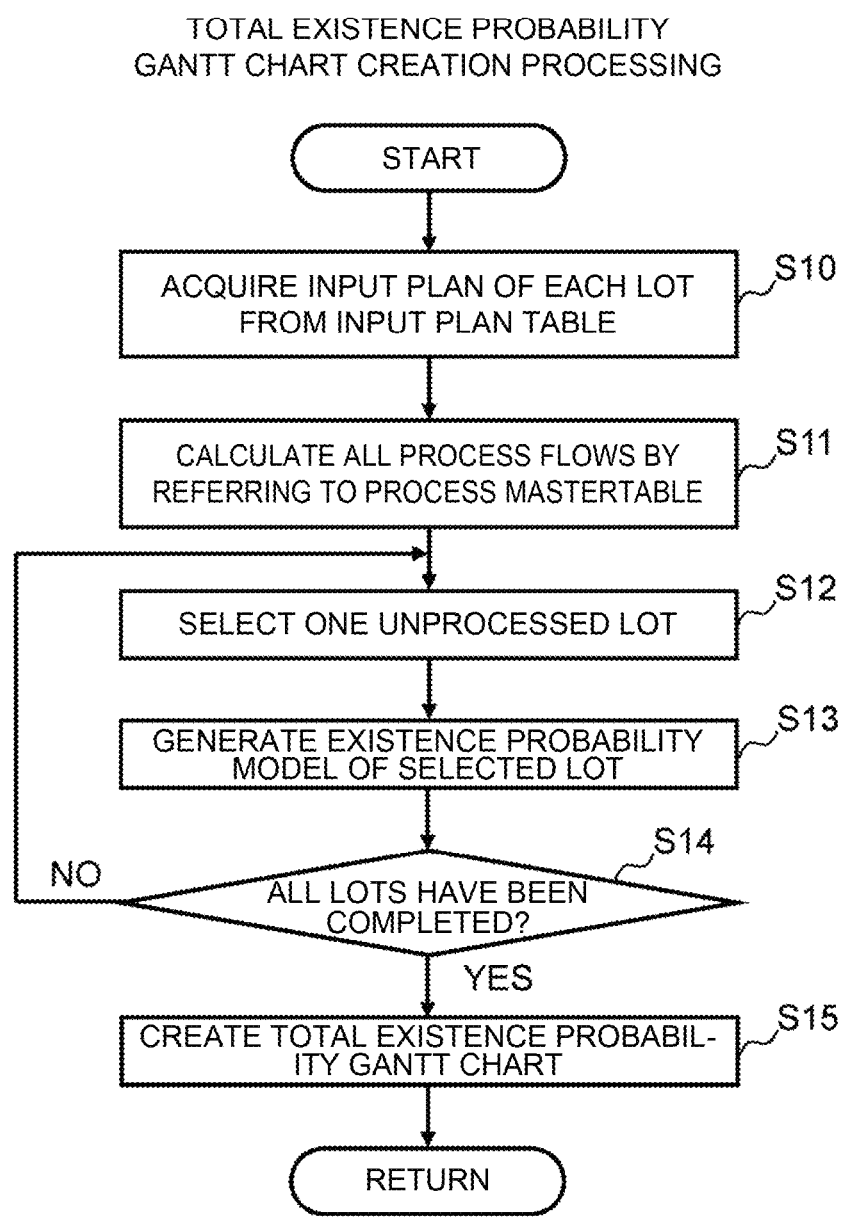
FIG. 24 is a flowchart illustrating a processing sequence for total existence probability Gantt chart creation processing.

FIG. 24 illustrates the specific processing content of the total existence probability Gantt chart creation processing executed by the production plan creation processing program 13 in step S1 of the production plan supporting processing described above with reference to FIG. 23.

Having proceeded to step S1 of the production plan supporting processing, the production plan creation processing program 13 starts the total existence probability Gantt chart creation processing illustrated in this FIG. 24 and firstly acquires the input plan to input each lot to the production process from the input plan table 15 (FIG. 17) (S10). Furthermore, the production plan creation processing program 13 refers to the process master table 16 (FIG. 18) and calculates each of all the routes in the production process (each route in FIG. 1A to FIG. 1C and FIG. 8A to FIG. 8C) (S11).

Subsequently, the production plan creation processing program 13: selects one lot regarding which step S13 and subsequent steps have not been processed yet (S12), and generates the existence probability model described earlier with reference to FIG. 3 and FIG. 9 in a case where the selected lot (hereinafter referred to as the selected lot) is input to the production process in accordance with the input plan acquired in step S10 (S13). Under this circumstance, the production plan creation processing program 13 generates the existence probability model(s) by reading the branching rates of the respective inter-process routes from the branching rate master table 17 and calculating the existence probability of the selected lot in each time slot of each process as a specific numerical value.

Next, the production plan creation processing program 13 judges, based on the input plan acquired in step S10, whether the generation of the existence probability models for all the lots scheduled to be input to the production process has been completed or not (S14). Then, if the production plan creation processing program 13 obtains a negative result in this judgment, it returns to step S12 and then repeats the processing from step S12 to step S14 by sequentially switching the lot to be selected in step S12 thereafter to another lot regarding which step S13 and subsequent steps have not been processed yet.

Then, when the production plan creation processing program 13 eventually obtains an affirmative result in step S14 by completing the generation of the existence probability models for all the lots, the production plan creation processing program 13: generates the total existence probability Gantt chart described earlier with reference to FIG. 6 and FIG. 11 by stacking the existence probability models for the respective lots one over another, which are generated by the repeating processing from step S12 to step S14 (S15); and then terminates this total existence probability Gantt chart creation processing and returns to the production plan supporting processing.

(1-3-3) Heat Map Update Processing

Figure 25:
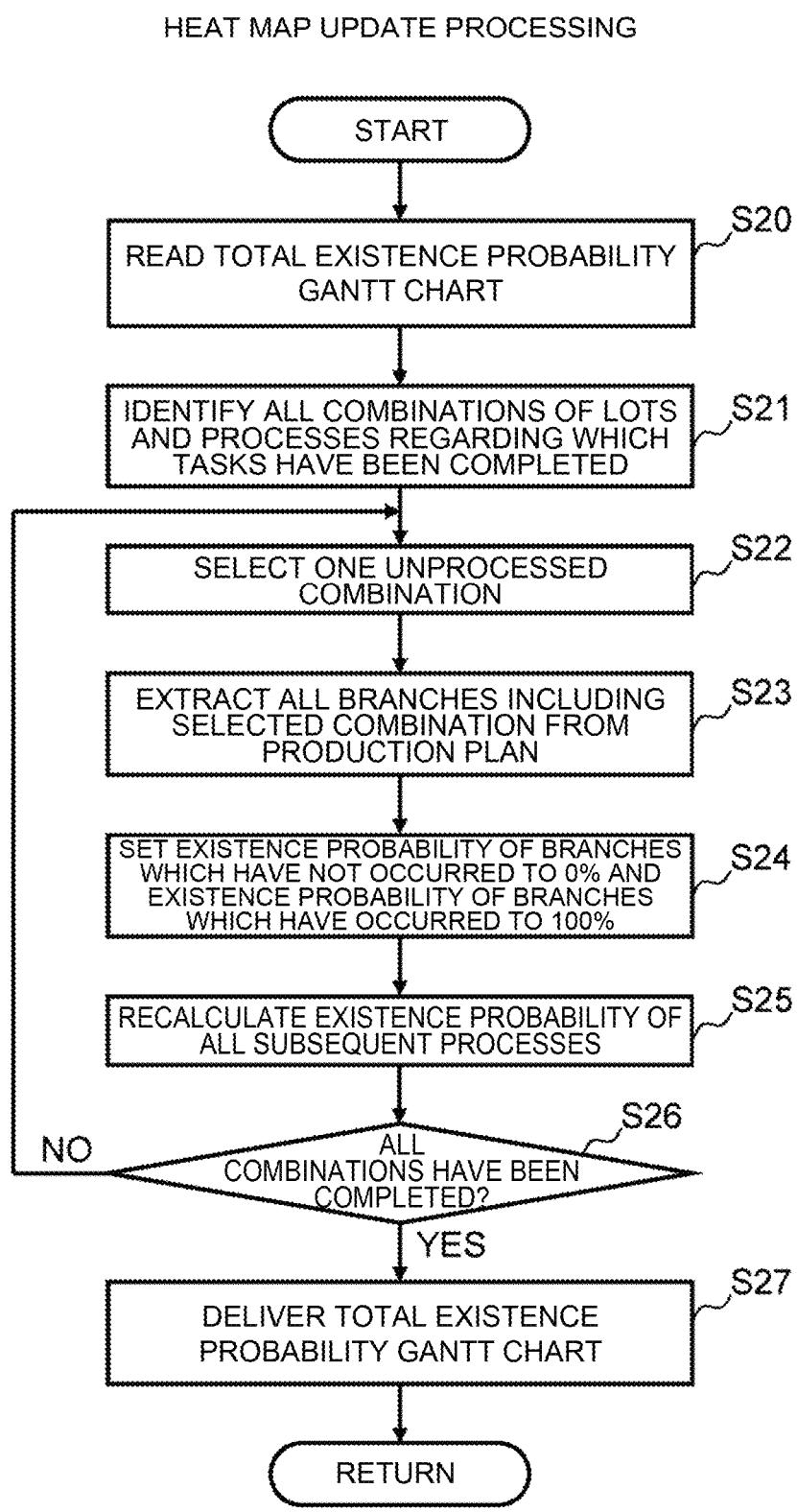
FIG. 25 is a flowchart illustrating a processing sequence for heat map update processing.

FIG. 25 illustrates a specific processing sequence for the heat map update processing executed by the production plan creation processing program 13 in step S4 of the production plan supporting processing described earlier with reference to FIG. 23.

Having proceeded to step S4 of the production plan supporting processing, the production plan creation processing program 13 starts the heat map update processing illustrated in this FIG. 25 and firstly reads the current total existence probability Gantt chart (S20). Furthermore, the production plan creation processing program 13 refers to the current task progress management table 18 (FIG. 20) and identifies all lot-and-process combinations regarding which tasks have been completed (S21).

Subsequently, the production plan creation processing program 13: selects one lot-and-process combination regarding which step S23 and subsequent steps have not been processed yet, from among the lot-and-process combinations regarding which the tasks identified in step S21 have been completed (S22); and extracts all branches including that lot-and-process combination from the total existence probability Gantt chart which was read in step S20 (S23).

Furthermore, regarding each branch extracted in step S23, the production plan creation processing program 13 changes the branching rate (the existence probability) of the branch, which did not occur, in the total existence probability Gantt chart which was read in step S20 to 0% and also changes the branching rate (the existence probability) of the branch, which occurred, to 100% (S24). Furthermore, the production plan creation processing program 13 recalculates the existence probability in each process after the relevant process of the relevant lot of the lot-and-process combination selected in step S22 in accordance with the changes in step S24 and updates the total existence probability Gantt chart, which was read in step S20, based on the calculation results (S25).

Subsequently, the production plan creation processing program 13 judges whether or not the execution of the processing of step S23 and subsequent steps has been completed with respect to all the lot-and-process combinations identified in step S21 (S26). Then, if the production plan creation processing program 13 obtains a negative result in this judgment, it returns to step S22 and then repeats the processing from step S22 to step S26 by sequentially switching the lot-and-process combination to be selected in step S22 thereafter to another lot-and-process combination regarding which step S23 and subsequent steps have not been processed yet.

Then, when the production plan creation processing program 13 eventually obtains an affirmative result in step S26 by completing the execution of the processing from step S23 to step S25 with respect to all the lot-and-process combinations identified in step S21, the production plan creation processing program 13 delivers final data of the total existence probability Gantt chart to the production plan display processing program 14 (FIG. 16) (S27) and then terminates this heat map update processing and returns to the production plan supporting processing in FIG. 23.

As a result, the production plan display processing program 14 generates the heat map described earlier with reference to FIG. 7 and FIG. 12 on the basis of the delivered data of the total existence probability Gantt chart, generates screen data of the bottleneck process prediction screen 20 (FIG. 21), on which the generated heat map is posted, and transmits the generated screen data to the relevant client 3. Accordingly, the bottleneck process prediction screen 20 based on this screen data is displayed on the client 3 (in other words, the heat map displayed on the bottleneck process prediction screen 20 is updated to the heat map with the content according to the current status).

(1-3-4) Bottleneck Measure Execution Processing

Figure 26:
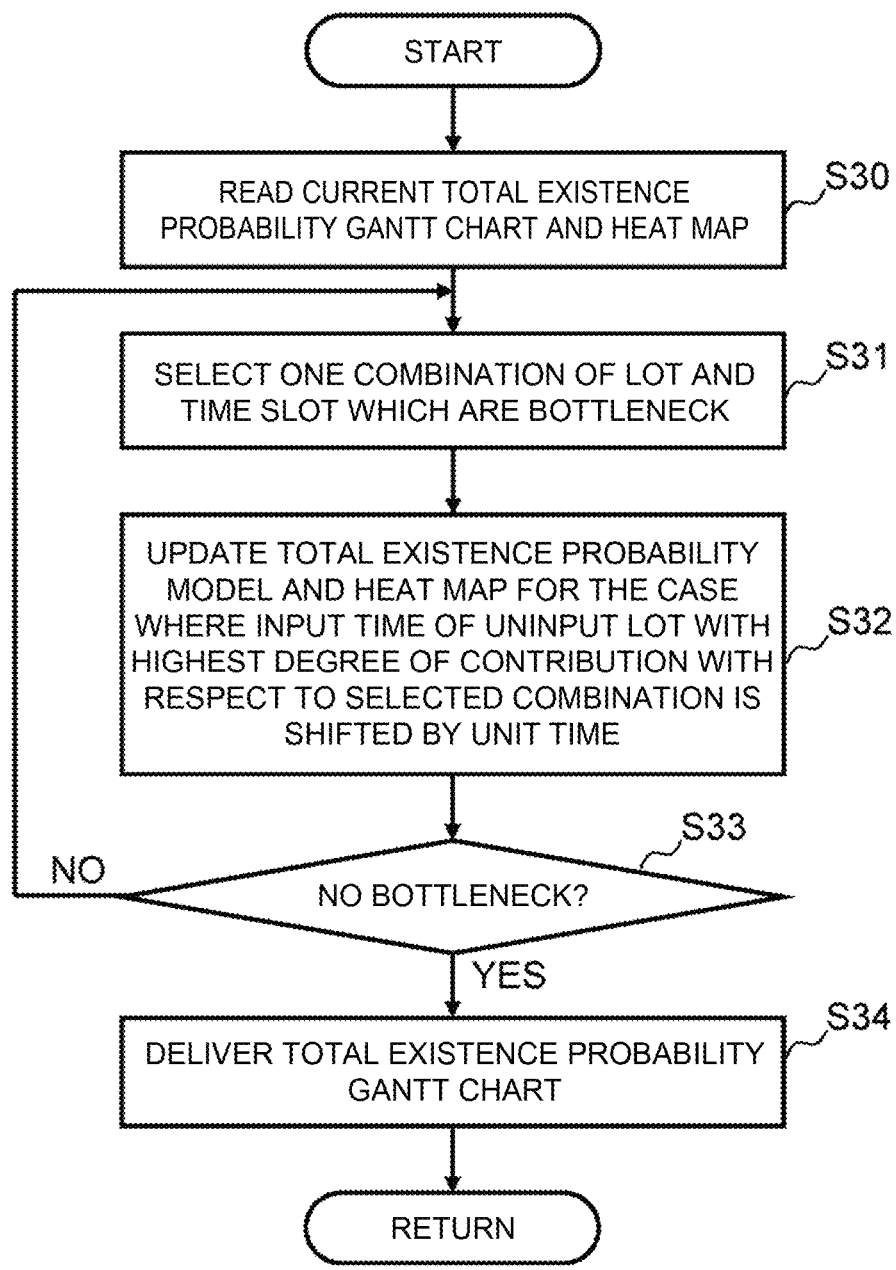
FIG. 26 is a flowchart illustrating a processing sequence for production plan making processing.

FIG. 26 illustrates a specific processing sequence for the bottleneck measure execution processing executed by the production plan creation processing program 13 in step S6 of the production plan supporting processing describe earlier with reference to FIG. 23.

Having proceeded to step S6 of the production plan supporting processing, the production plan creation processing program 13 starts bottleneck process prediction processing illustrated in this drawing and firstly reads the total existence probability Gantt chart relating to the current status (S30).

Subsequently, the production plan creation processing program 13 selects one process-and-time-slot combination which is a bottleneck (S31). Specifically speaking, the production plan creation processing program 13 selects one process-and-time-slot combination regarding which the maximum existence probability of the work in the total existence probability Gantt chart exceeds "100%" or other preset existence probabilities.

Next, the production plan creation processing program 13 updates the total existence probability Gantt chart which was read in step S30 to the state where with respect to the selected process-and-time-slot combination, the time to input a lot with the highest degree of contribution to the bottleneck, among lots which have not been input to the production process yet, is delayed only by each unit time (for example, an hour) (S32). Incidentally, the lot with the highest existence probability among the lots which may possibly reach that process in that time slot can be applied as the "lot with the highest degree of contribution."

Subsequently, the production plan creation processing program 13 judges, based on the updated total existence probability Gantt chart, whether the process-and-time-slot combination which is the bottleneck (that is, the process-and-time-slot combination regarding which the maximum existence probability of the work exceeds "100%" or other preset existence probabilities) exists or not (S33); and if the above-described combination exists, the production plan creation processing program 13 returns to step S31 and then repeats the processing from step S31 to step S33.

Then, when the production plan creation processing program 13 eventually obtains an affirmative result in step S33 as the process-and-time-slot combination which is the bottleneck no longer exists, it delivers data of the total existence probability Gantt chart at that time to the production plan display processing program 14 (S34) and then terminates this bottleneck measure execution processing and returns to the production plan supporting processing in FIG. 23.

As a result, the production plan display processing program 14 generates the heat map described earlier with reference to FIG. 7 and FIG. 12 on the basis of this total existence probability Gantt chart, generates screen data of the bottleneck process prediction screen 20 (FIG. 21) on which the generated heat map is posted, and transmits the generated screen data to the client 3. Accordingly, the bottleneck process prediction screen 20 on which the heat map based on the production plan made as described above is posted is displayed on the client 3.

(1-3-5) Bottleneck Process Prediction Screen Display Processing

Figure 27:
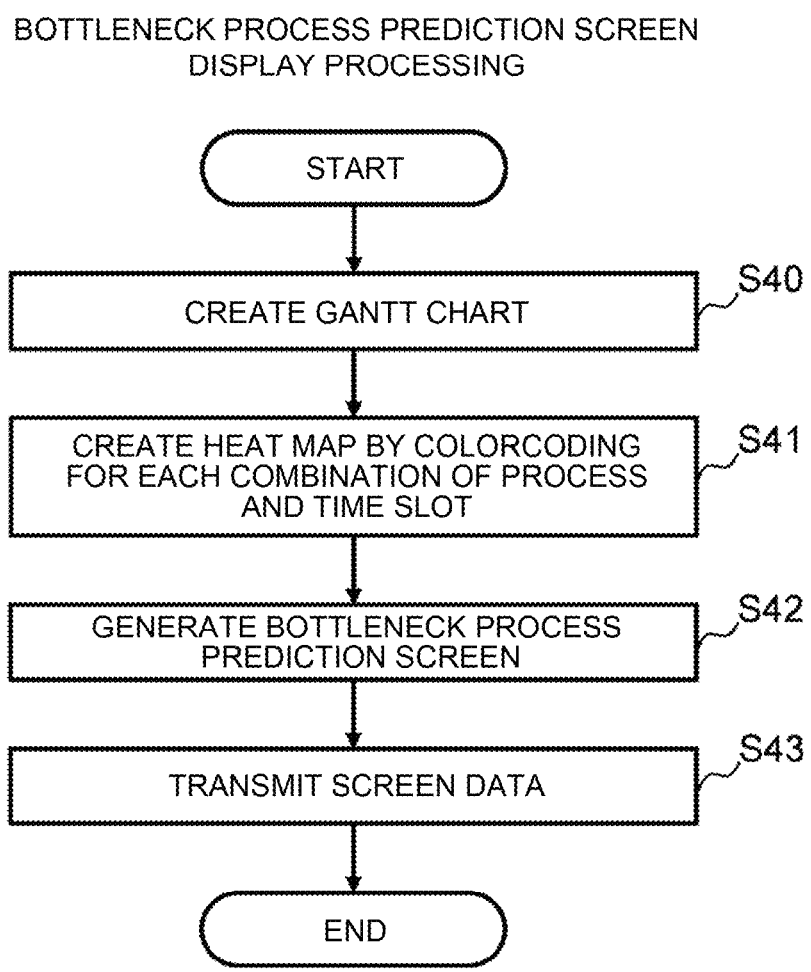
FIG. 27 is a flowchart illustrating a processing sequence for bottleneck process prediction screen display processing.

On the other hand, FIG. 27 illustrates a processing sequence for the bottleneck process prediction screen display processing executed by the production plan display processing program 14 (FIG. 16) to which the data of the total existence probability Gantt chart was delivered in step S2 of FIG. 23, step S27 of FIG. 25, or step S34 of FIG. 26. The production plan display processing program 14 causes the relevant client 3 to display the bottleneck process prediction screen 20 based on the data of the total existence probability Gantt chart, which was delivered from the production plan creation processing program 13, in accordance with the processing sequence illustrated in this FIG. 27.

Practically, after the data of the total existence probability Gantt chart is delivered from the production plan creation processing program 13, the production plan display processing program 14 starts the bottleneck process prediction screen display processing illustrated in this FIG. 27 and firstly generates a Gantt chart by arranging the processes in a sequential order of the routes along the vertical axis and the time slots along the horizontal axis on the basis of data of the total probability model (S40). Incidentally, this Gantt chart corresponds to the heat map described earlier with reference to FIG. 7 and FIG. 12 without coloring or the like according to the maximum existence probabilities of the works.

Subsequently, the production plan display processing program 14 generates the heat map described earlier with reference to FIG. 7 and FIG. 12 by coloring the Gantt chart generated in step S40 for each time slot of each process with colors or densities according to the maximum existence probability of the work in that process and that time slot (S41).

Next, the production plan display processing program 14 generates the bottleneck process prediction screen 20 on which the heat map generated in step S41 is posted (S42), and transmits screen data of the generated bottleneck process prediction screen 20 to the relevant client 3 (S43). Accordingly, the above-described bottleneck process prediction screen 20 based on this screen data is displayed on that client 3. Subsequently, the production plan display processing program terminates this bottleneck process prediction screen display processing.

(1-4) Advantageous Effects of this Embodiment

With the production plan supporting system 1 according to this embodiment described above, the heat map in which the maximum existence probability of the work is indicated for each time slot of each process and which is code-colored or colored according to the densities in accordance with the size of the maximum existence probability is displayed.

Therefore, the user can easily recognize the time slot of the process which will become a bottleneck, by referring to the heat map and can take countermeasures by, for example, making the production plan for allocating many resources such as the personnel and the equipment to the time slot of the process which will become the bottleneck, and shifting the timing to input each lot to the production process.

Accordingly, this production plan supporting system 1 can make it easier to make the production plan in consideration of branches of the processes and can thereby support making of the production plan for the product produced by the production process with the branches.

(2) Second Embodiment

Figure 28:
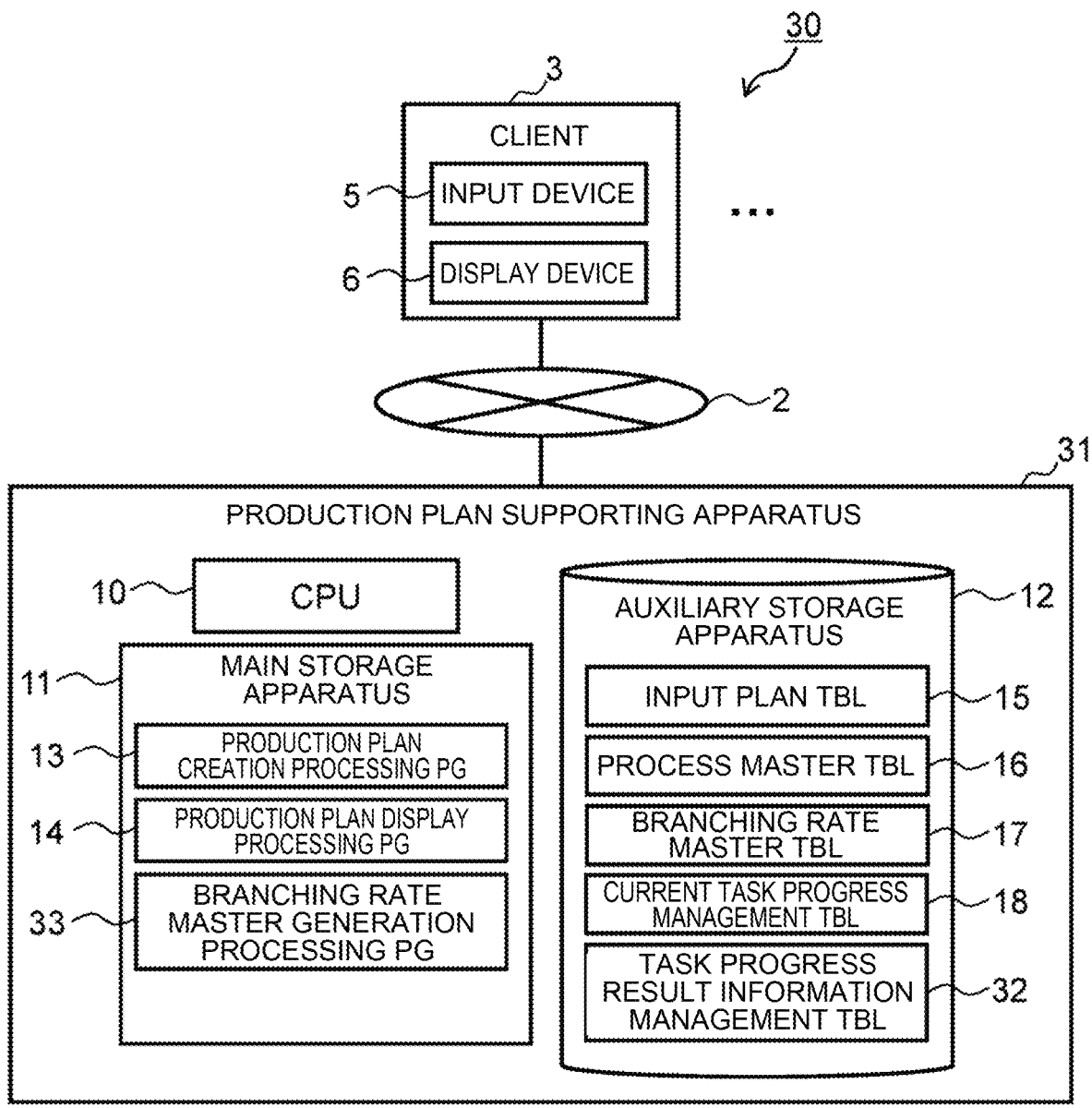
FIG. 28 is a block diagram illustrating an overall configuration of a production plan supporting system according to a second embodiment.

FIG. 28 in which the same reference numerals as in FIG. 1 are assigned to parts corresponding to those in FIG. 1 illustrates a production plan supporting system 30 according to a second embodiment. The difference between this production plan supporting system 30 and the first embodiment is that a production plan supporting apparatus 31 creates the branching rate master table 17 based on past actual results; and besides this difference, the production plan supporting system 30 is configured in the same manner as the production plan supporting system 1 according to the first embodiment.

Accordingly, with the production plan supporting system 30 according to this embodiment, a task progress result information management table 32 is stored in the auxiliary storage apparatus 12 for the production plan supporting apparatus 31 and a branching rate master table creation processing program 33 is stored in the main storage apparatus 11 for the production plan supporting apparatus 31 as means for creating the branching rate master table 17.

Figure 29:
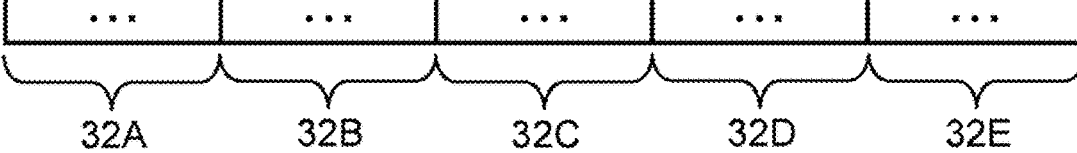
FIG. 29 is a chart illustrating a structure example of a task progress result information management table.

The task progress result information management table 32 is a table used to manage the actual result information of the task progress at the time of production in the past and is configured as illustrated in FIG. 29 by including a lot ID column 32A, an item name column 32B, a process name column 32C, a start date and time column 32D, and an end date and time column 32E. One row of the task progress result information management table 32 corresponds to one process conducted for one lot in the past; and every time when one process for one lot is finished, new actual result information is sequentially registered by storing necessary information in the top unused row.

Then, the lot ID column 32A stores the lot ID of a lot which was input to the production process in the past; and the item name column 32B stores the item name of the product of that lot. Furthermore, the process name column 32C stores the process name of the relevant process. Furthermore, the start date and time column 32D stores the time of day when the task for the relevant process for that lot was started; and the end date and time column 32E stores the time of day when the task for the relevant process for that lot ended.

Therefore, in the case of the example in FIG. 29, it is disclosed that, for example, the lot with the lot ID "L1" was input to the production process at "9:00," went through the respective processes "A," "B," "C," and "D" in this order, and finished the process "D" at "13:00."

On the other hand, the branching rate master table creation processing program 33 is a program having a function that generates the branching rate master table 17 based on the actual result information registered in the task progress result information management table 32. When a request is given from the client 3 to display the bottleneck process prediction screen 20 (FIG. 21), the branching rate master table creation processing program 33 generates the branching rate master table 17 before the production plan creation processing program 13 starts the production plan supporting processing described earlier with reference to FIG. 23.

Figure 30:
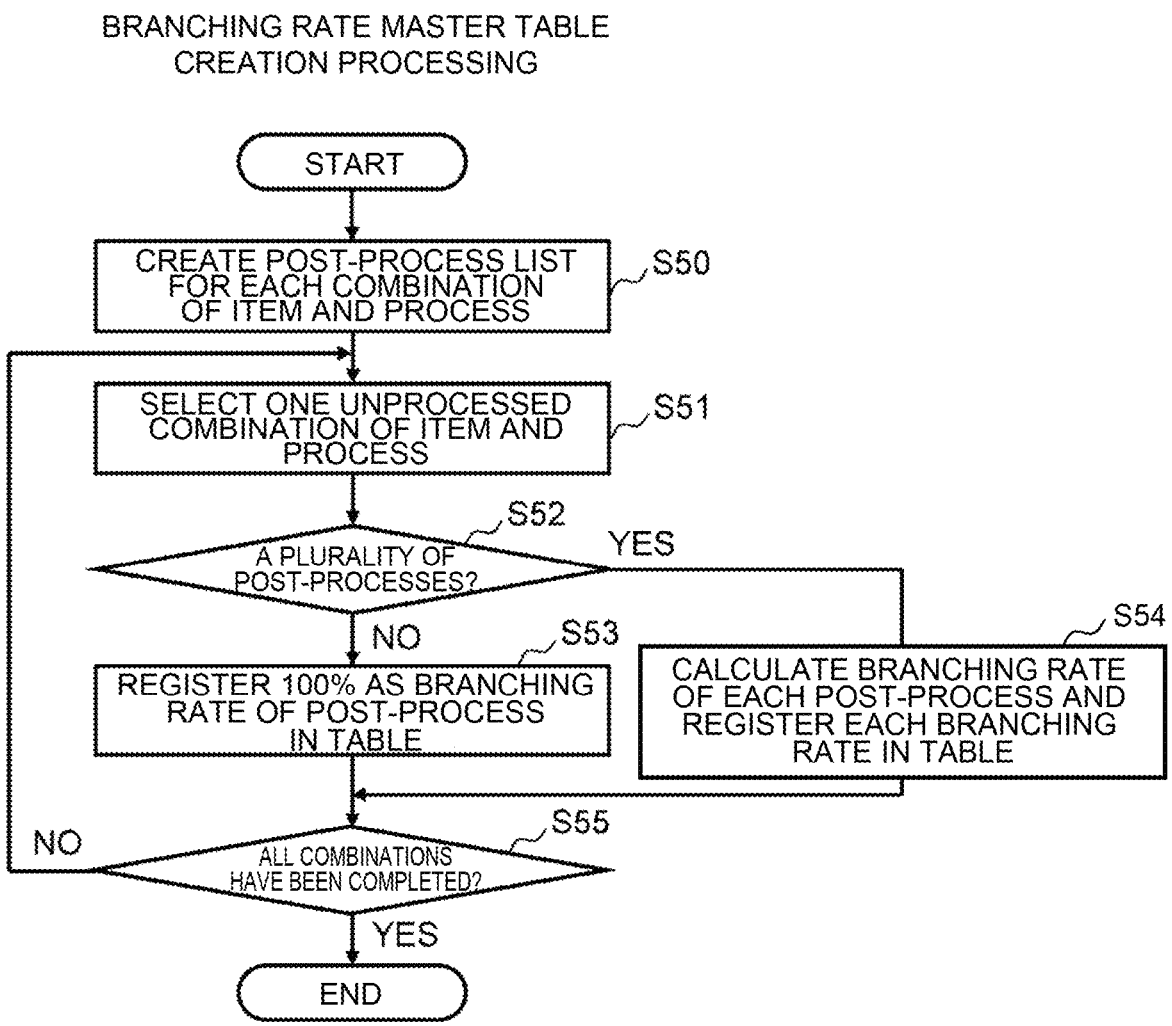
FIG. 30 is a flowchart illustrating a processing sequence for branching rate master table creation processing.

FIG. 30 illustrates a specific processing sequence for a series of processing executed by the branching rate master table creation processing program 33 to generate the branching rate master table 17 (hereinafter referred to as the branching rate master table creation processing).

After receiving the request from the client 3 to display the bottleneck process prediction screen 20, the branching rate master table creation processing program 33 starts the branching rate master table creation processing illustrated in this FIG. 30 and firstly creates a post-process list for each item-and-process combination by referring to the process master table 16 (FIG. 16) (S50).

Subsequently, the branching rate master table creation processing program 33: selects one combination from among the item-and-process combinations for which the lists were created in step S50 (S51); and judges whether or not a plurality of post-processes exist in the post-process list of that combination (S52).

Then, if the branching rate master table creation processing program 33 obtains a negative result in step S52, it determines the branching rate of the relevant item, which constitutes that combination, from that process to the post-process to be 100%, associates the determined branching rate with such item, the process, and the post-process, and registers them in the branching rate master table 17 (S53).

Furthermore, if the branching rate master table creation processing program 33 obtains an affirmative result in step S52, it calculates the branching rate of the relevant item, which constitutes that combination, from the relevant process to each post-process by, for example, the method described earlier with reference to FIG. 4, associates the calculated branching rate for each post-process with the relevant item, the process, and the post-process, and registers them in the branching rate master table 17 (S54).

Next, the branching rate master table creation processing program 33 judges whether or not the execution of the processing in step S52 and subsequent steps has been completed with respect to all the item-and-process combinations for which the lists were created in step S50 (S55). Then, if the branching rate master table creation processing program 33 obtains a negative result in this judgment, it returns to step S51 and then repeats the processing from step S51 to step S55 by sequentially switching the item-and-process combination to be selected in step S51 thereafter to another unprocessed combination.

Then, when the branching rate master table creation processing program 33 eventually obtains an affirmative result in step S55 by completing the execution of the processing in step S52 and subsequent steps with respect to all the item-and-process combinations for which the lists were created in step S50, it terminates this branching rate master table creation processing.

Accordingly, the production plan supporting system 30 according to this embodiment described above can omit the trouble for the user to create the branching rate master table 17 and thereby reduce the time required for the production plan making task. Therefore, the production plan supporting system 30 according to this embodiment can make it much easier to make the production plan as compared to the production plan supporting system 1 according to the first embodiment.

(3) Other Embodiments

Incidentally, the aforementioned first and second embodiments have described the case where: when works are sequentially input on a production unit basis to the production process in accordance with a predetermined input plan, the first processing unit that generates, for the respective production units, the first models (existence probability models) for which the probability of the work to exist in each time slot of each process is calculated, and generates a second model (total probability model) by stacking all the generated first models for the respective production units one over another is configured by the production plan creation processing program 13; and the second processing unit that identifies and displays the time slot of the process which will become a bottleneck on the basis of the second model generated by the first processing unit is configured by the production plan display processing program 14. However, the present invention is not limited to this example and one program or hardware having the functions of both the production plan creation processing program 13 and the production plan display processing program 14 may be provided instead of the production plan creation processing program 13 and the production plan display processing program 14.

Furthermore, the aforementioned embodiments have described the case where the production plan supporting apparatus 4 identifies the time slot of the process which will become the bottleneck, and displays it as the bottleneck process prediction screen 20 as illustrated in FIG. 21 on the client 3; however, the present invention is not limited to this example and, for example, only the time slot of the process which will become the bottleneck may be displayed as a text and a wide variety of other display methods can be applied as a method for displaying the time slot of the process which will become the bottleneck (a method of presentation to the user).

Furthermore, the aforementioned first and second embodiments have described the case where the heat map on the bottleneck process prediction screen 20 is updated to the content according to the current status at the timing when the update button 22 on the bottleneck process prediction screen 20 is clicked; however, the present invention is not limited to this example and, for example, the production plan supporting apparatus 4 may update the heat map on the bottleneck process prediction screen 20 to the content according to the current status every time when one process for one lot is completed.

INDUSTRIAL APPLICABILITY

The present invention can be applied to a wide variety of production plan supporting apparatuses for supporting making of the production plan for the product whose production process has a branch(es).

REFERENCE SIGNS LIST

1, 30: production plan supporting system
3: client
4, 31: production plan supporting apparatus
10: CPU
11: main storage apparatus
12: auxiliary storage apparatus
13: production plan creation processing program
14: production plan display processing program
15: input plan table
16: process master table
17: branching rate master table
18: current task progress management table
20: bottleneck process prediction screen
32: task progress result information management table
33: branching rate master table creation processing program

The invention claimed is:

1. A production plan supporting apparatus for supporting making of a production plan for a product, the production plan supporting apparatus comprising:
a processor coupled to a memory storing instructions, the processor being configured to:
when sequentially inputting a work on a production unit basis in accordance with a predetermined input plan, generate, for respective production units, first models regarding each of which probability of existence of the work in each time slot of each process is calculated, and generate a second model in which all the generated first models for the respective production units are stacked over one another;
identify and display the time slot of the process which will become a bottleneck on a basis of the second model generated;
calculate a maximum value of the probability of existence of the work in each time slot of each process as maximum existence probability on the basis of the second model; and
predict and display the time slot of the process which will become the bottleneck on a basis of the calculated maximum existence probability in each time slot of each process.

2. The production plan supporting apparatus according to claim 1, wherein a plurality of items exist as the work, wherein production process varies for each item, and
wherein the processor generates the first models for the respective production units for respective items and generates the second model in which all the generated first models for the respective production units are stacked over one another.

3. The production plan supporting apparatus according to claim 1, wherein the processor generates the second model by shifting timing to input the work for the production units to the production process, from among the work of each production unit determined in the input plan, so that the time slot of the process which will become the bottleneck will not occur, and
wherein the processor predicts and displays the time slot where the process which will become the bottleneck will occur on the basis of the second model.

4. The production plan supporting apparatus according to claim 1, wherein the processor calculates a rate at which the work as the production unit proceeds to each process which is each branch destination at a branch of production process as a branching rate from an actual result and generates the first models based on the calculated branching rate.

5. The production plan supporting apparatus according to claim 1, wherein the processor updates the second model according to a current status, and
wherein the processor identifies and displays the time slot of the process which will become the bottleneck on a basis on the updated second model.

6. A production plan supporting method executed by a production plan supporting apparatus for supporting making of a production plan for a product, the production plan supporting method comprising:
a first step, which is executed when sequentially inputting a work on a production unit basis to a production process in accordance with a predetermined input plan, of generating, for respective production units, first models regarding each of which probability of existence of the work in each time slot of each process is calculated, and generating a second model in which all the generated first models for the respective production units are stacked over one another; and a second step of identifying and displaying the time slot of the process which will become a bottleneck on a basis of the generated second model, wherein, in the second step:

a maximum value of the probability of existence of the work in each time slot of each process is calculated as maximum existence probability on the basis of the generated second model; and the time slot of the process which will become the bottleneck is predicted and displayed on a basis of the calculated maximum existence probability in each time slot of each process.

7. The production plan supporting method according to claim 6, wherein a plurality of items exist as the work, wherein the production process varies for each item, and wherein, in the first step, the first models are generated for the respective production units for the respective items and the second model in which all the generated first models for the respective production units are stacked over one another is generated.

8. The production plan supporting method according to claim 6, further comprising:

a third step of generating the second model by shifting timing to input the work for the production units to the production process, from among the work of each production unit determined in the input plan, so that the time slot of the process which will become the bottleneck will not occur; and a fourth step of predicting and displaying the time slot where the process which will become the bottleneck will occur on the basis of the generated second model.

9. The production plan supporting method according to claim 6, wherein, in the first step, a rate at which the work as the production unit proceeds to each process which is each branch destination at a branch of the production process is calculated as a branching rate from an actual result and the first models are generated based on the calculated branching rate.

10. The production plan supporting method according to claim 6, further comprising:

a third step of updating the second model according to a current status; and a fourth step of identifying and displaying the time slot of the process which will become the bottleneck on a basis on the updated second model.

* * * * *